United States Patent
Mungekar et al.

(10) Patent No.: US 7,628,897 B2
(45) Date of Patent: Dec. 8, 2009

(54) REACTIVE ION ETCHING FOR SEMICONDUCTOR DEVICE FEATURE TOPOGRAPHY MODIFICATION

(75) Inventors: Hemant P. Mungekar, San Jose, CA (US); Anjana M. Patel, San Jose, CA (US); Manoj Vellaikal, Santa Clara, CA (US); Anchuan Wang, Fremont, CA (US); Bikram Kapoor, Santa Clara, CA (US)

(73) Assignee: Applied Materials, Inc., Santa Clara, CA (US)

( * ) Notice: Subject to any disclaimer, the term of this patent is extended or adjusted under 35 U.S.C. 154(b) by 324 days.

(21) Appl. No.: 10/660,813

(22) Filed: Sep. 12, 2003

(65) Prior Publication Data

US 2004/0079728 A1 Apr. 29, 2004

Related U.S. Application Data

(63) Continuation-in-part of application No. 10/279,961, filed on Oct. 23, 2002, now Pat. No. 6,802,944.

(51) Int. Cl.
*C23C 14/35* (2006.01)
*C23C 16/00* (2006.01)
*H01L 21/311* (2006.01)

(52) U.S. Cl. .............. 204/192.37; 204/192.32; 427/255.28; 427/255.37; 427/255.29; 438/694; 438/696; 438/703; 438/706; 438/707; 438/710; 438/723

(58) Field of Classification Search ............ 204/192.32, 204/192.37; 427/255.28, 255.37, 255.29; 438/694, 696, 703, 706, 707, 710, 723; 216/67, 216/80
See application file for complete search history.

(56) References Cited

U.S. PATENT DOCUMENTS

| 4,690,746 A | 9/1987 | McInerney et al. |
| 4,737,379 A | 4/1988 | Hudgens et al. |

(Continued)

FOREIGN PATENT DOCUMENTS

GB    2 267 291    12/1993

(Continued)

OTHER PUBLICATIONS

Abraham, "Reactive Facet Tapering of Plasma Oxide For Multilevel Interconnect Applications," VMIC Conference. pp. 115-121 (1987).

(Continued)

*Primary Examiner*—Rodney G McDonald
(74) *Attorney, Agent, or Firm*—Townsend and Townsend and Crew

(57) ABSTRACT

A film is deposited on a substrate disposed in a substrate processing chamber. The substrate has a trench formed between adjacent raised surfaces. A first portion of the film is deposited over the substrate from a first gaseous mixture flowed into the process chamber by chemical-vapor deposition. Thereafter, the first portion is etched by flowing an etchant gas having a halogen precursor, a hydrogen precursor, and an oxygen precursor into the process chamber. Thereafter, a second portion of the film is deposited over the substrate from a second gaseous mixture flowed into the processing chamber by chemical-vapor deposition.

28 Claims, 12 Drawing Sheets

U.S. PATENT DOCUMENTS

| | | | |
|---|---|---|---|
| 4,835,005 A | 5/1989 | Hirooka et al. | |
| 4,872,947 A | 10/1989 | Wang et al. | |
| 4,890,575 A | 1/1990 | Ito et al. | |
| 4,892,753 A | 1/1990 | Wang et al. | |
| 4,960,488 A | 10/1990 | Law et al. | |
| 5,000,113 A | 3/1991 | Wang et al. | |
| 5,089,442 A | 2/1992 | Olmer | |
| 5,156,881 A | 10/1992 | Okano et al. | |
| 5,271,972 A | 12/1993 | Kwok et al. | |
| 5,275,977 A | 1/1994 | Otsubo et al. | |
| 5,279,865 A | 1/1994 | Chebi et al. | |
| 5,302,233 A | 4/1994 | Kim et al. | |
| 5,319,247 A | 6/1994 | Matsuura | |
| 5,362,526 A | 11/1994 | Wang et al. | |
| 5,416,048 A | 5/1995 | Blalock et al. | |
| 5,468,342 A | 11/1995 | Nulty et al. | |
| 5,571,576 A | 11/1996 | Qian et al. | |
| 5,599,740 A | 2/1997 | Jang et al. | |
| 5,624,582 A | 4/1997 | Cain | |
| 5,645,645 A | 7/1997 | Zhang et al. | |
| 5,679,606 A | 10/1997 | Wang et al. | |
| 5,712,185 A | 1/1998 | Tsai et al. | |
| 5,719,085 A | 2/1998 | Moon et al. | |
| 5,756,402 A * | 5/1998 | Jimbo et al. | 438/724 |
| 5,804,259 A | 9/1998 | Robles | |
| 5,850,105 A | 12/1998 | Dawson et al. | |
| 5,858,876 A | 1/1999 | Chew | |
| 5,872,052 A | 2/1999 | Iyer | |
| 5,872,058 A | 2/1999 | Van Cleemput et al. | |
| 5,910,342 A | 6/1999 | Hirooka et al. | |
| 5,913,140 A | 6/1999 | Roche et al. | |
| 5,915,190 A | 6/1999 | Pirkle | |
| 5,937,323 A | 8/1999 | Orczyk et al. | |
| 5,953,635 A | 9/1999 | Andideh | |
| 5,968,610 A | 10/1999 | Liu et al. | |
| 5,976,327 A | 11/1999 | Tanaka | |
| 5,990,000 A | 11/1999 | Hong et al. | |
| 5,990,013 A | 11/1999 | Berenguer et al. | |
| 6,013,191 A | 1/2000 | Nasser-Faili et al. | |
| 6,013,584 A | 1/2000 | M'Saad | |
| 6,030,881 A | 2/2000 | Papasouliotis et al. | |
| 6,037,018 A | 3/2000 | Jang et al. | |
| 6,039,851 A | 3/2000 | Iyer | |
| 6,059,643 A | 5/2000 | Hu et al. | |
| 6,136,685 A | 10/2000 | Narwankar et al. | |
| 6,167,834 B1 | 1/2001 | Wang et al. | |
| 6,170,428 B1 | 1/2001 | Redeker et al. | |
| 6,182,602 B1 | 2/2001 | Redeker et al. | |
| 6,189,483 B1 | 2/2001 | Ishikawa et al. | |
| 6,191,026 B1 | 2/2001 | Rana et al. | |
| 6,194,038 B1 | 2/2001 | Rossman | |
| 6,197,705 B1 | 3/2001 | Vassiliev | |
| 6,203,863 B1 | 3/2001 | Liu et al. | |
| 6,217,658 B1 | 4/2001 | Orczyk et al. | |
| 6,228,751 B1 | 5/2001 | Yamazaki et al. | |
| 6,313,010 B1 | 11/2001 | Nag et al. | |
| 6,335,288 B1 | 1/2002 | Kwan et al. | |
| 6,395,150 B1 | 5/2002 | Van Cleemput et al. | |
| 6,503,843 B1 | 1/2003 | Xia et al. | |
| 6,596,654 B1 * | 7/2003 | Bayman et al. | 438/788 |
| 6,794,290 B1 * | 9/2004 | Papasouliotis et al. | 438/694 |
| 6,846,745 B1 * | 1/2005 | Papasouliotis et al. | 438/706 |
| 2002/0187655 A1 | 12/2002 | Tan | |

FOREIGN PATENT DOCUMENTS

| | | |
|---|---|---|
| JP | 2058836 A | 2/1990 |
| JP | 7-161703 A | 6/1995 |

OTHER PUBLICATIONS

Lee et al., "Dielectric Planarization Techniques For Narrow Pitch Multilevel Interconnects," VMIC Conference, pp. 85-92 (1987).

Musaka, "Single Step Gap Filling Technology fo Subhalf Micron Metal Spacings on Plasma Enhanced TEOS/02 Chemical Vapor Deposition System," International Conference on Solid State Devices and Materials pp. 510-512, held in Japan, (1993).

Nalwa, H.S., Handbook of Low and High Dielectric Constant Materials and Their Applications, vol. 1, p. 66 (1999).

Nguyen, s.v., "High-Density Plasma Chemical Vapor Deposition of Silicon-Based Dielectric Films for Integrated Circuits," Journal of Research and Development, vol. 43, 1/2(1999).

Qian et al., "High Density Plasma Deposition and Deep Submicron Gap Fill with Low Dielectric Constant SiOF Films," DUMIC Conference, pp. 50-56, held in California (1995).

Vassilieuv et al., "Trends in void-free pre-metal CVD dielectrics," *Solid State Technology*, 2001, pp. 129-136, www.solid-state.com.

* cited by examiner

NANOMETRICS 2D CONTOUR MAP

Wafer Size: 200mm
Edge Exclusion: 3.0mm
Points: 49 out of 49

Statistics Data:
Mean:       613Å
StdD:       154.4Å
%StdD:      25.17%
%NonU:      47.02%
Max:        898Å
Min:        321Å
Range:      577Å
Interval:   23.1Å
%Interval:  3.762%

Comment:

NANOMETRICS 2D CONTOUR MAP

Wafer Size: 200mm
Edge Exclusion: 3.0mm
Points: 49 out of 49

Statistics Data:
Mean:       488Å
StdD:       46.3Å
%StdD:      9.48%
%NonU:      20.67%
Max:        561Å
Min:        359Å
Range:      202Å
Interval:   8.1Å
%Interval:  1.654%

Comment:
7

REACTIVE ION ETCHING FOR SEMICONDUCTOR DEVICE FEATURE TOPOGRAPHY MODIFICATION

CROSS REFERENCE TO RELATED APPLICATION

This application is a continuation-in-part application of U.S. patent application Ser. No. 10/279,961, entitled "HIGH DENSITY PLASMA CVD PROCESS FOR GAPFILL INTO HIGH ASPECT RATIO FEATURES," filed Oct. 23, 2002 by Farhan Ahmad et al., the entire disclosure of which is incorporated herein by reference for all purposes.

BACKGROUND OF THE INVENTION

One of the persistent challenges faced in the development of semiconductor technology is the desire to increase the density of circuit elements and interconnections on substrates without introducing spurious interactions between them. Unwanted interactions are typically prevented by providing gaps or trenches that are filled with electrically insulative material to isolate the elements both physically and electrically. As circuit densities increase, however, the widths of these gaps decrease, increase their aspect ratios and making it progressively more difficult to fill the gaps without leaving voids. The formation of voids when the gap is not filled completely is undesirable because they may adversely affect operation of the completed device, such as by trapping impurities within the insulative material.

Common techniques that are used in such gapfill applications are chemical-vapor deposition ("CVD") techniques. Conventional thermal CVD processes supply reactive gases to the substrate surface where heat-induced chemical reactions take place to produce a desired film. Plasma-enhanced CVD ("PECVD") techniques promote excitation and/or dissociation of the reactant gases by the application of radio-frequency ("RF") energy to a reaction zone near the substrate surface, thereby creating a plasma. The high reactivity of the species in the plasma reduces the energy required for a chemical reaction to take place, and thus lowers the temperature required for such CVD processes when compared with conventional thermal CVD processes. These advantages may be further exploited by high-density-plasma ("HDP") CVD techniques, in which a dense plasma is formed at low vacuum pressures so that the plasma species are even more reactive. While each of these techniques falls broadly under the umbrella of "CVD techniques," each of them has characteristic properties that make them more or less suitable for certain specific applications.

In some instances where gaps have a large aspect ratio and narrow width, gaps have been filled with thermal CVD techniques using a "dep/etch/dep" process by sequentially depositing material, etching some of it back, and depositing additional material. The etching step acts to reshape the partially filled gap, opening it so that more material can be deposited before it closes up and leaves an interior void. Such dep/etch/dep processes have also been used with PECVD techniques, but some thermal and PECVD techniques are still unable to fill gaps having very large aspect ratios even by cycling deposition and etching steps. More recently, dep/etch/dep processes have additionally be used with HDP-CVD techniques, even though such technique have generally had superior gapfill capabilities because they provide a sputtering component to the deposition simultaneous with film growth. It is for this reason, in fact, that HDP-CVD techniques are sometimes referred to as simultaneous dep/etch processes.

With all such dep/etch/dep techniques, a remaining difficulty has been an inability to control the etching characteristics as carefully as desired during the etching phase. Lack of sufficient control of the etching characteristics may result in such undesirable results as corner clipping, in which a structural portion defining the gaps is damaged because of excessive etching at that point. Furthermore, less control over the etching characteristics also decreases the efficiency of the overall gapfill process since reopening the gap during the etching phase may not provide as useful a profile as might be achieved with greater control. These issues have become increasingly important as integrated circuit designs have increasingly employed smaller minimum feature sizes, now often less than 0.1 µm.

BRIEF SUMMARY OF THE INVENTION

Embodiments of the invention provide for an improvement in etch control during a dep/etch/dep process by using a chemistry that allows more precise control over the both the concentration and distribution of etchant atoms in a process chamber. In addition to flowing an etchant-ion precursor, a reactive scavenging-ion precursor may also be flowed in desired flow patterns to selectively reduce the concentration of the etchant atoms in specific regions of the chamber. Furthermore, the chemical nature of such an etching process may also be combined with a physical sputtering process to provide extremely good overall gapfill capability with the process.

Thus, in one embodiment, a method is provided for depositing a film on a substrate disposed in a substrate processing chamber. The substrate has a trench formed between adjacent raised surfaces. A first portion of the film is deposited over the substrate from a first gaseous mixture flowed into the process chamber by chemical-vapor deposition. Thereafter, the first portion is etched by flowing an etchant gas comprising a halogen precursor, a hydrogen precursor, and an oxygen precursor into the process chamber. Thereafter, a second portion of the film is deposited over the substrate from a second gaseous mixture flowed into the processing chamber by chemical-vapor deposition.

There are a variety of different precursors that may be used. For example, the hydrogen precursor may comprise $H_2$; in some cases, the hydrogen and oxygen precursors are comprised by a single compound such as $H_2O$ or $H_2O_2$. The halogen precursor may comprise a fluorine precursor such as $NF_3$, $F_2$, or $SiF_4$, among other precursors. In one embodiment where the fluorine precursor comprises $NF_3$, the substrate may include a silicon nitride layer and a flow rate of the hydrogen precursor and a flow rate of the $NF_3$ may be adjusted to control a relative concentration of NO and F in the processing chamber.

Etching the first portion may be performed by maintaining a plasma formed from the etchant gas. In some cases, the plasma may be a high-density plasma, in which case the etchant gas may further comprise an inert sputtering agent such as Ar or He. In one embodiment, the etching is performed with a sputter/removal ratio between 0.0 and 0.8, where the sputter/removal ratio corresponds to a ratio of a volume of material removed by sputtering to a total volume of material removed by a combination of sputtering and chemical etching. The sputtering may be enhanced by biasing the plasma towards the substrate. Deposition of the first and second portions of the film may also be performed with plasma processes by maintaining plasmas formed from the first and second gaseous mixtures.

In one embodiment, a radially nonuniform etching distribution over the substrate is effected by flowing the hydrogen precursor at different flow rates to different parts of the processing chamber.

In another embodiment, a method is also provided for depositing a film on a substrate disposed in a substrate processing chamber. The substrate has a trench formed between adjacent raised surfaces. A first portion of the film is deposited over the substrate by forming a plasma from a first gaseous mixture flowed into the processing chamber. Thereafter, the first portion is etched by forming a plasma from an etchant gas mixture flowed into the processing chamber. The etchant gas mixture comprises a first precursor gas reactive with the film, a second precursor gas reactive with the first precursor gas, and an inert sputtering agent flowed into the processing chamber at respective flow rates to control relative isotropic and anisotropic contributions to the etching. Thereafter, a second portion of the film is deposited by forming a plasma from a second gaseous mixture. In some cases, the plasma formed from the etchant gas may be biased towards the substrate. In other cases, the second precursor gas may be flowed to provide a different distribution within the processing chamber than the first precursor gas, thereby effecting a nonuniform etching distribution over the substrate.

A further understanding of the nature and advantages of the present invention may be realized by reference to the remaining portions of the specification and the drawings.

DETAILED DESCRIPTION OF THE INVENTION

1. Introduction

Embodiments of the invention are directed to methods and apparatus for depositing a film to fill a gap in a surface of a substrate with a multistep deposition and etching process. Films deposited according to the techniques of the invention have excellent gapfill capabilities and are able to fill high-aspect-ratio gaps encountered in, for example, shallow-trench-isolation ("STI"), intermetal-dielectric ("IMD"), and premetal-dielectric ("PMD") structures, among others. Films deposited by the methods of the invention are suitable for use in the fabrication of a variety of integrated circuits, and are particularly useful in technology that uses minimum feature sizes of 0.06 μm or smaller.

Figure 1A:
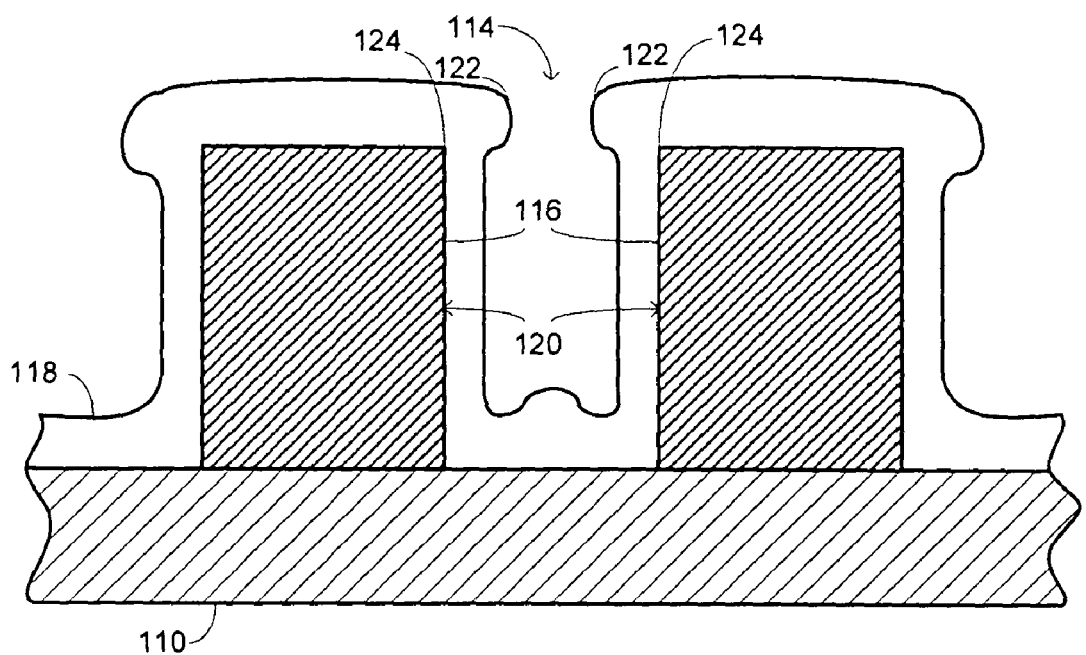
FIGS. 1A and 1B are schematic cross-sectional drawings illustrating the formation of a void during a gapfill process.
Figure 1B:
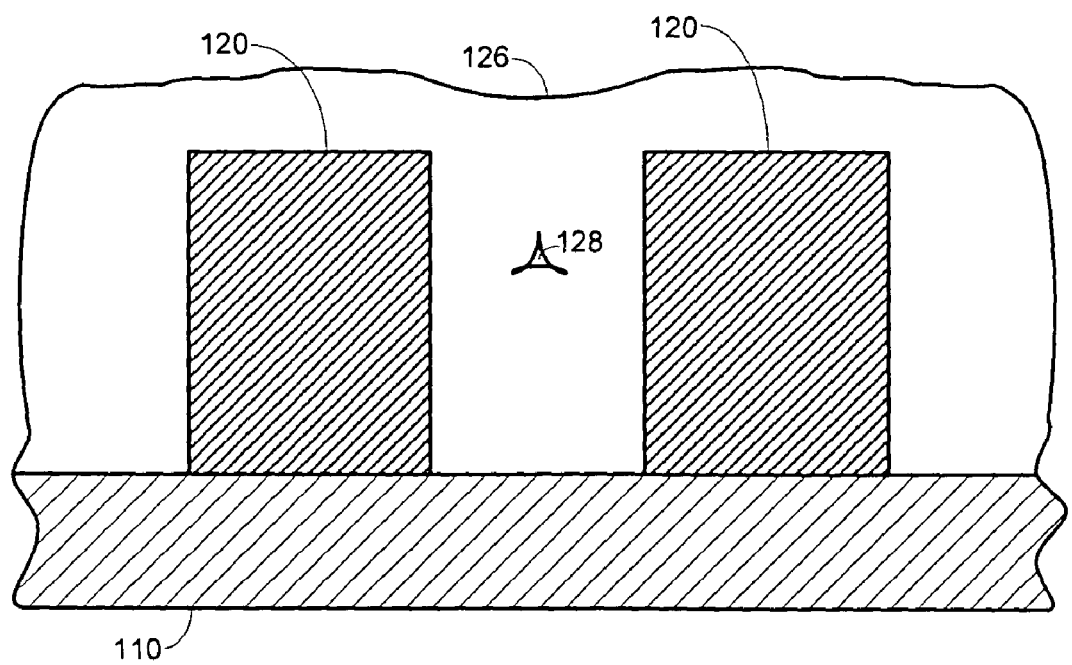

The gapfill problem addressed by embodiments of the invention is illustrated schematically with the cross-sectional views shown in FIGS. 1A and 1B. FIG. 1A shows a vertical cross section of a substrate 110, such as may be provided with a semiconductor wafer, having a layer of features 120. Adjacent features define gaps 114 that are to be filled with dielectric material 118, with the sidewalls 116 of the gaps being defined by the surfaces of the features 120. As the deposition proceeds, dielectric material 118 accumulates on the surfaces of the features 120, as well as on the substrate 110 and forms overhangs 122 at the corners 124 of the features 120. As deposition of the dielectric material 118 continues, the overhangs 122 typically grow faster than the gap 114 in a characteristic breadloafing fashion. Eventually, the overhangs 122 grow together to form the dielectric layer 126 shown in FIG. 1B, preventing deposition into an interior void 128.

2. Dep/Etch/Dep Processes

The deposition processes described herein have improved gapfill capability that avoids the formation of such an interior void. Often, the processes described herein are exemplified in the discussion below by specific reference to HDP-CVD techniques. It should be recognized throughout, however, that the processes may also be used in other types of gapfill techniques, including most generally any gapfill technique process that provides asymmetric deposition. Thus, the processes described herein may readily be adapted for use in other plasma-based CVD techniques such as PECVD, as well as for some thermal CVD techniques such as sub-atmospheric CVD ("SACVD"), low-pressure CVD ("LPCVD"), and the like. In those embodiments that do make use of an HDP-CVD technique, a high-density plasma is generated from a gaseous mixture, with "high density" being characterized by the plasma having an ion density greater than about $10^{11}$ ions/cm$^3$.

Embodiments of the invention make use of a dep/etch/dep process that provides improved control over relative contributions from isotropic and anisotropic components of the etching step. In some embodiments, the dep/etch/dep process is performed as a continuous process, although a noncontinuous process may be used in alternative embodiments. In those embodiments that make use of plasma-based techniques, a continuous process may avoid the need for separate plasma generation in each of the individual deposition and etching phases. The composition of the deposited film is defined by the elements comprised by precursor gases during the deposition phases. For example, to deposit a silicon oxide film, the precursor gases may include a silicon-containing gas, such as silane $SiH_4$, and an oxygen-containing gas, such as $O_2$. Dopants may be added to the film by including a precursor gas with the desired dopant, such as by including a flow of $SiF_4$ to fluorinate the film, including a flow of $PH_3$ to phosphorate the film, including a flow of $B_2H_6$ to boronate the film, including a flow of $N_2$ to nitrogenate the film, and the like. The fluent gas may be provided with a flow of $H_2$ or with a flow of an inert gas, including a flow of He, a flow of Ne, a flow of Ar, or a flow of a heavier inert gas such as Xe. The level of sputtering provided by the different fluent gases is inversely related to their atomic mass (or molecular mass in the case of $H_2$), with $H_2$ producing even less sputtering than He. References herein to "silicate glass" are intended to refer to any such films, both including undoped and silicate glass.

To better appreciate and understand the present invention, reference is made to FIG. 2A, which is a flow diagram that depicts steps associated with one embodiment, and to FIG. 2B, which provides simplified cross-sectional views of a structure at different points during the process described in connection with FIG. 2A. The structure is shown as a substrate having trenches etched therein as part of an STI structure, but the principles described herein may be applied more generally to any structure that defines gaps to be filled, including IMD and PMD applications, among others.

Figure 2A:
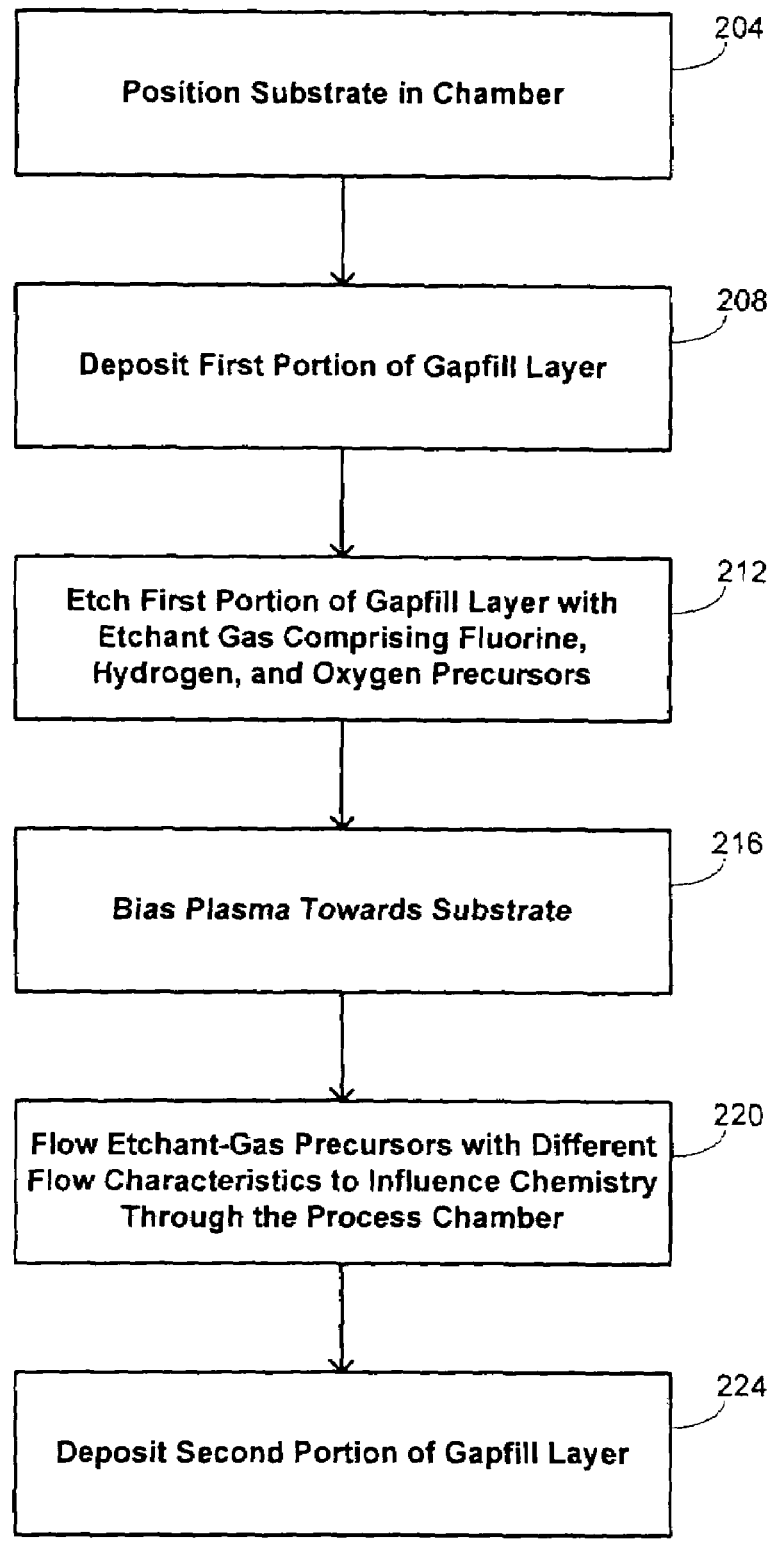
FIG. 2A is a flow diagram illustrating a method for depositing a film to fill a gap in one embodiment of the invention.

As shown in FIG. 2A, the process starts by positioning a substrate in a substrate-processing chamber at block 204. The substrate has an initial structure 251 shown schematically in FIG. 2B with features 250 that form one or more gaps to be filled with dielectric material. The features 250 may be, for example, areas of a substrate between etched trenches, adjacent metal lines, transistor gates, or other features. In some instances, the structure 251 may additionally include silicon nitride portions above the raised features and/or a silicon nitride liner along the interior of the gaps. The presence of such a liner may increase the aspect ratio of the gap even further.

Once the substrate is properly positioned, the first portion of the gapfill layer is deposited at block 208. This portion may be deposited by any suitable CVD technique, such as by forming a high-density plasma from suitable precursor gases in the case of an HDP-CVD application. The effectiveness of the gapfill during this initial deposition phase may be improved with a number of techniques that have previously been disclosed in certain commonly assigned patent applications. For instance, while Ar is frequently suitable as a fluent gas provided in addition to the precursor gases, improved gapfill may be achieved with He as a fluent gas, such as described further in copending, commonly assigned U.S. patent application Ser. No. 10/137,132, entitled "METHOD FOR HIGH ASPECT RATIO HDP CVD GAPFILL," filed Apr. 30, 2002 by Zhong Qiang Hua et al., the entire disclosure of which is herein incorporated by reference for all purposes. In other instances, the deposition may be performed with $H_2$ as a fluent gas as described further in copending, commonly assigned U.S. patent application Ser. No. 109/854,406, entitled "HYDROGEN ASSISTED UNDOPED SILICON OXIDE DEPOSITION PROCESS FOR HDP-CVD," filed May 11, 2001 by Zhengquan Tan et al., the entire disclosure of which is incorporated herein by reference for all purposes. In some cases, the deposition may be performed as two or more distinct depositions using different fluent gases, such as with He as a fluent gas during a first deposition and $H_2$ as a fluent gas during a second deposition, as described in copending, commonly assigned U.S. patent application Ser. No. 10/350,445, entitled "HYDROGEN ASSISTED HDP-CVD DEPOSITION PROCESS FOR AGGRESSIVE GAP-FILL TECHNOLOGY," filed Jan. 23, 2003 by Bikram Kapoor et al., the entire disclosure of which is herein incorporated by reference for all purposes. In still other instances, the fluent gas may be provided as a premixture of gases, such as a premixture of He and Ar, a premixture of He and $H_2$, a premixture of $H_2$ and Ar, and the like, as described in copending, commonly assigned U.S. patent application Ser. No. 10/456,611, entitled "HDP-CVD MULTISTEP GAPFILL PROCESS," filed Jun. 5, 2003 by M. Ziaul Karim et al., the entire disclosure of which is herein incorporated by reference for all purposes.

Generally, conventional silicate glass deposition techniques result in direct silicate glass deposition on the horizontal surfaces of the substrate, such as on surfaces 274 within the gaps and on surfaces 275 above the raised portions that define the gaps. In addition, the deposition process also results in indirect deposition, often referred to as "redeposition," of silicate glass on sidewalls 276 due to the recombination of material sputtered from the silicate glass film as it grows. In certain small-width high-aspect-ratio applications where the techniques of the present invention are most beneficial, the continued growth of the silicate glass film results in the formation of a significant cusp 258, as shown for intermediate structure 252, with silicate glass being deposited more thickly near the corners of the underlying structures than on the sidewalls.

This cusp feature is somewhat protective during the subsequent etching at block 212 and resulting in structure 253. As indicated at block 212 of FIG. 2A, the etching step is performed by flowing an etchant gas that comprises halogen, hydrogen, and oxygen precursors, from which a plasma may be formed. The hydrogen precursor may comprise $H_2$ and the oxygen precursor may comprise $O_2$, among a variety of other potential precursors. For instance, in some embodiments, the hydrogen and oxygen precursors may be comprised by a single compound such as $H_2O$ or $H_2O_2$. The halogen precursor is often provided as a fluorine precursor, which may typically comprises $NF_3$, but may alternative comprise $F_2$, $SiF_4$, and the like. As discussed further below, additional benefits may result from the use of $NF_3$ in structures that include silicon nitride. The halogen precursor provides a chemical etchant component and in some alternative embodiments this chemical etching may be supplemented with an inert sputtering component by including an inert sputtering agent such as Ar, Ne, or He in the etchant gas as well. Inclusion of such an inert sputtering agent results in a process that effectively combines physical and chemical etches in the process. As will be evident from the following description improved control over etch characteristics may be achieved with the reactive hydrogen precursor.

The inclusion of a hydrogen precursor in the etchant gas has at least two effects that may be controlled by manipulation of relative flow rates of the halogen precursor and hydrogen precursor. These effects allow the etch rate to be slowed and to provide greater control over the etching. For instance, in the case where only a small modification of a partially filled structure is needed, i.e. on the order of hundreds of Å, an etch rate less than about 15 Å/s may be desirable to ensure control over the etching. In addition, the slower etch rate also results in a decrease in metal contamination, usually Al contamination, that is sometimes caused by reaction of the halogen with interior surfaces of the processing chamber.

First, the hydrogen precursor acts as a diluent to reduce the concentration of halogen ions in the plasma. Second, the hydrogen precursor provides scavenging hydrogen atoms and ions that are highly reactive with the halogen atoms in the plasma, thereby permitting the amount of chemical etching to be controlled with the relative flow rates. The chemical etching resulting from the halogen precursor thus provides an isotropic component to the removal of material, while an anisotropic component is provided by the ionizied oxygen and any ionized inert sputtering agent that may be included. Very little, if any, anisotropic component is provided by the hydrogen since hydrogen has a very low sputtering yield. The relative contributions between these different removal components is sometimes quantified with a "sputter/removal ratio," which is equal to the volume of material removed through anisotropic processes divided by the total volume of material removed. Thus, for example, a purely isotropic process would have a sputter/removal ratio of 0.0 and a purely anisotropic process would have a sputter/removal ratio of 1.0. A complementary quantifier that may alternatively be used is the "etch/removal ratio," which is defined as the volume of material removed through isotropic processes divided by the total volume of material removed. The inventors have discovered that especially good gapfill may be achieved in embodiments of the invention when the etch step 212 is performed with a sputter/removal ratio of 0.0-0.8. An illustration of the relative effects of isotropic and anisotropic etching processes is provided in connection with FIGS. 3A-3C below.

In embodiments where the substrate includes silicon nitride, the particular chemistry provided by $NF_3$ as the halogen precursor may have additional benefits. In particular, the formation of NO is known to have a role in the chemistry of silicon nitride etching. The ability to control the amount of fluorine available for etching by controlling the relative flows of the fluorine and hydrogen precursors permits selectivity to be exercised over respective levels of silicate glass and silicon nitride etching. The exercise of such selectivity permits the silicate glass that needs to be etched back for the subsequent deposition step to be etched while at the same time ensuring that the silicon nitride portions of the structure remain substantially untouched.

There are still other mechanisms that may be used to control the etching with the arrangement described. For example, as indicated at block 216 of FIG. 2A, in some instances, the plasma may be electrically biased towards the substrate. Such biasing increases the anisotropic etching component by attracting the ionic species in the plasma towards the substrate. In some instances, as indicated at block 220, the individual precursors may be provided with different flow characteristics through the process chamber. These different flows may result in different concentrations of various elements at different points in the chamber, allowing the etch to be performed selectively across the substrate as a whole. More specific discussion regarding such differences in flow characteristics is provided in connection with FIG. 4 below. It should be appreciated that while blocks 216 and 220 are shown in FIG. 2A separate from block 212, the steps represented by those blocks may be performed concurrently.

Figure 2B:
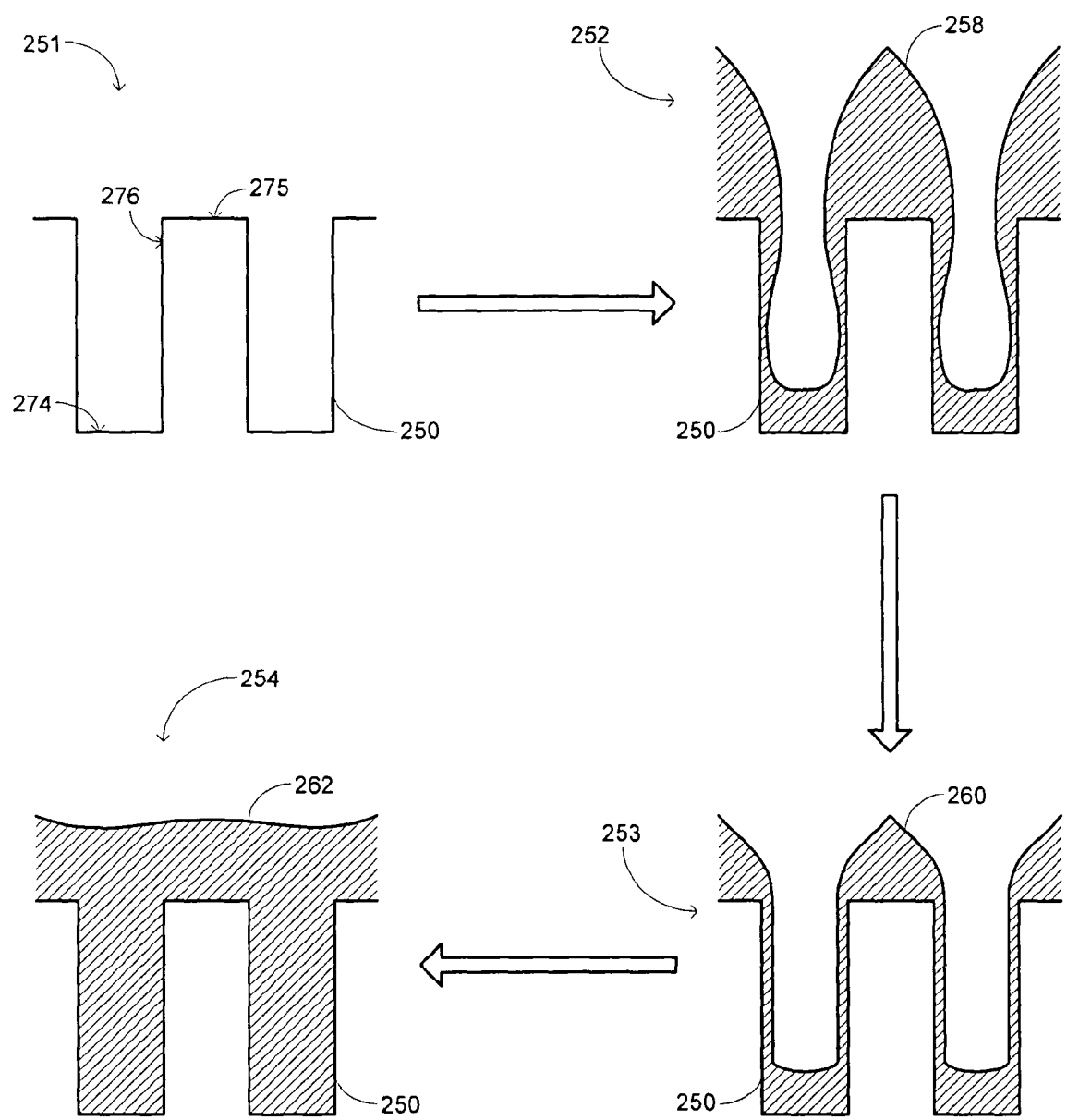
FIG. 2B provides schematic cross-sectional drawings illustrating how a high-aspect-ratio feature may be filled using a dep/etch/dep process according to an embodiment of the invention.

Etching of structure 252 in FIG. 2B results in structure 253 by shaping the deposited layer 260 so that the basic shape of the original features 250 are retained, but with a less severe aspect ratio. At block 224, a second portion of the silicate glass layer is deposited over the substrate so that the features 250 are filled completely with the silicate glass 262, as shown schematically with structure 254. In some embodiments, deposition of the second portion is performed using substantially the same process as used to deposit the first portion, although in some instances the deposition parameters may be adjusted to optimize the deposition characteristics to accommodate the gap profile as modified by the preceding deposition and etching. Furthermore, depending on how aggressive the gapfill requirement is for a particular application, a sequence of interleaved deposition and etching steps may be repeated multiple times before a final deposition step.

In one embodiment, the transition to the etching step 212 is effected by stopping the flow of a silicon source gas used as a precursor deposition gas, adjusting other gas flows as discussed further below, and perhaps also adjusting the RF bias power applied to the substrate while maintaining the plasma from the deposition step. Similarly, transitions to other steps in this embodiment also maintain a plasma in the process chamber while varying gas flows, chamber pressure, RF power levels, and other parameters. Embodiments that maintain a plasma while transitioning to subsequent steps are performed in situ in a single chamber. In other embodiments, the plasma is extinguished between steps, gas flows and other parameters are adjusted in preparation for the next step, and a plasma is reformed. Such embodiments may be performed as in situ processes in a single chamber (or in different chambers of a multichamber system), or may be performed as ex situ processes in different chambers. In some embodiments, in situ processes are preferred for throughput and performance reasons.

Figure 3A:
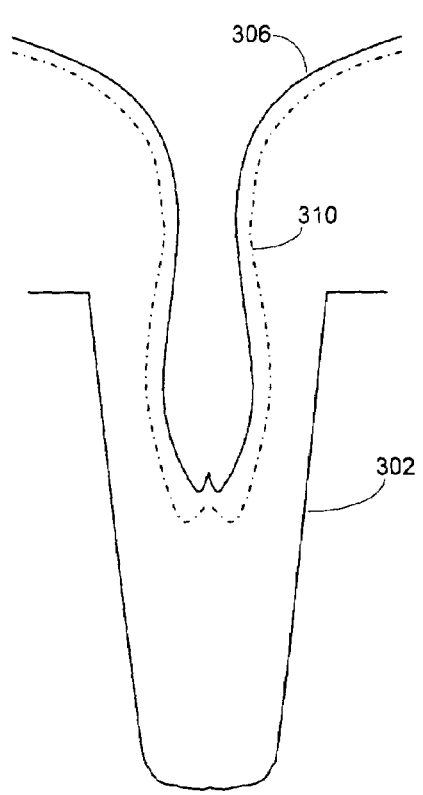
FIGS. 3A-3C are schematic cross-sectional drawings illustrating the effects of isotropic and anisotropic etches.
Figure 3B:
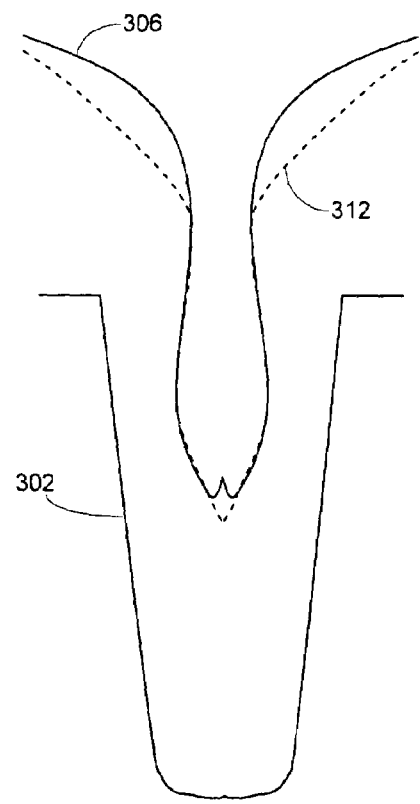
Figure 3C:
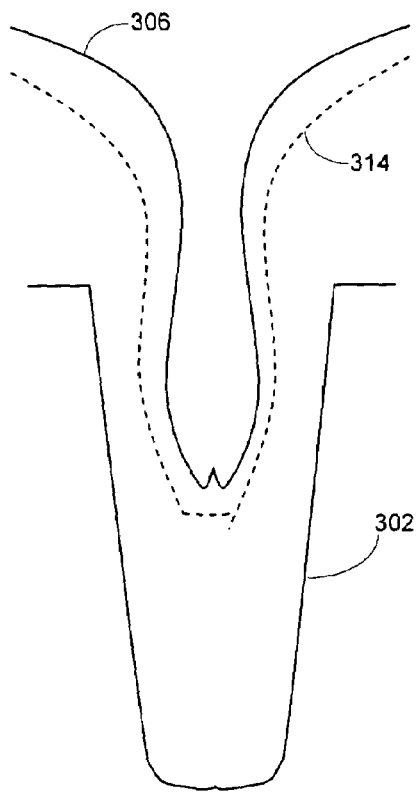

The relative effects of anisotropic and isotropic etching characteristics during the etching phase are illustrated with the schematic cross-sectional drawings in FIGS. 3A-3C. In each of FIGS. 3A-3C, the gap profile is denoted 302 and the profile of the deposited material is denoted 306. FIG. 3A illustrates the effect of a purely isotropic etch, i.e. an etch having a sputter/removal ratio of 0.0. When material is etched isotropically, the etch rate does not have a directional preference as material is removed to produce profile 310. This may be contrasted with the purely anisotropic etching illustrated in FIG. 3B, in which the sputter/removal ratio is 1.0. In this case material is preferably removed in a downwards direction to reduce the size of the cusps, producing profile 312. As can be seen, purely anisotropic etching might not widen the gap laterally. FIG. 3C illustrates the effect on the profile of deposited material when isotropic and anisotropic etching components are combined. The illustration in FIG. 3C may correspond, for example, to those embodiments in which the sputter/removal ratio is in the range 0.0-0.8. The combination of isotropic and anisotropic etching both widens the gap and suppresses the cusping to facilitate more aggressive gapfill applications.

Figure 4:
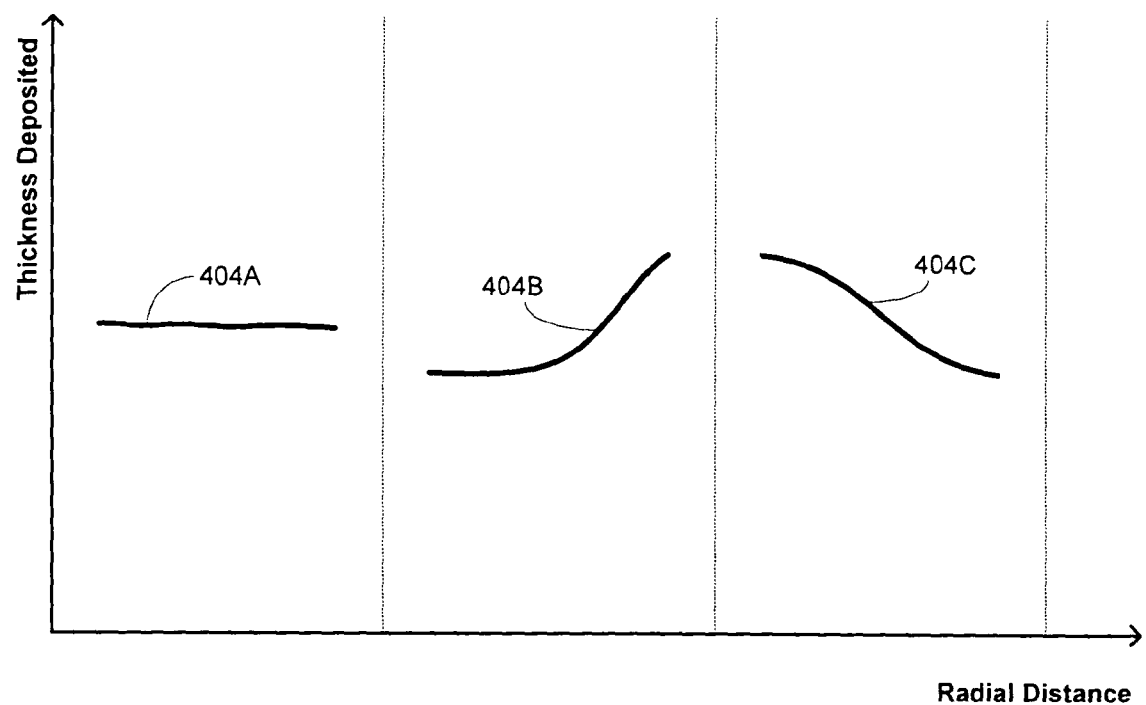
FIG. 4 provides a graphical illustration of the use of nonuniform etch characteristics to compensate for processes having a nonuniformity in the deposition processes.
Figure 4:
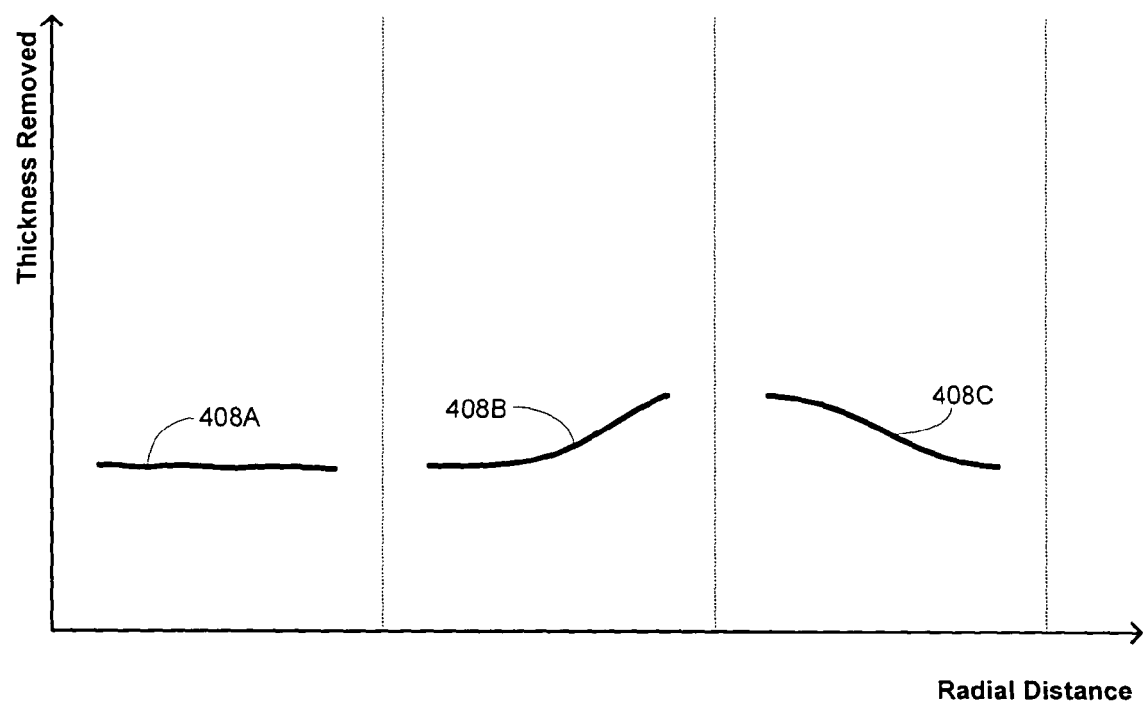

The effect of providing different flow characteristics during the etching phase is illustrated in FIG. 4. This illustration focuses on the case where the final film is preferably substantially uniform, although it is possible to use the same principles to deposit a film nonuniformly in other instances. The top graph of FIG. 4 provides profiles of thicknesses deposited during the deposition phase as a function of radial distance since most substrates are currently comprised by silicon wafers having a circular cross section; the thickness variations have been exaggerated for purposes of illustration. The bottom graph of FIG. 4 provides corresponding illustrations of etching profiles that may be used to compensate for nonuniformities produced in the deposition phases. For example, if the deposition is substantially uniform, as indicated by curve 404A, it may be desirable for the etching also to be substantially uniform, as indicated by curve 408A. If the deposition is preferentially edge-fast so that a greater thickness of material is deposited at the edge of the substrate as shown by curve 404B, it may be desirable for the etching also to be edge-fast to remove more material at the edge, as shown by curve 408B. Similarly, if the deposition is preferentially center-fast so that a greater thickness of material is deposited in the center of the substrate, as shown by curve 404C, it may be desirable for the etching also to be center-fast, as shown by curve 408C.

Figure 5A:
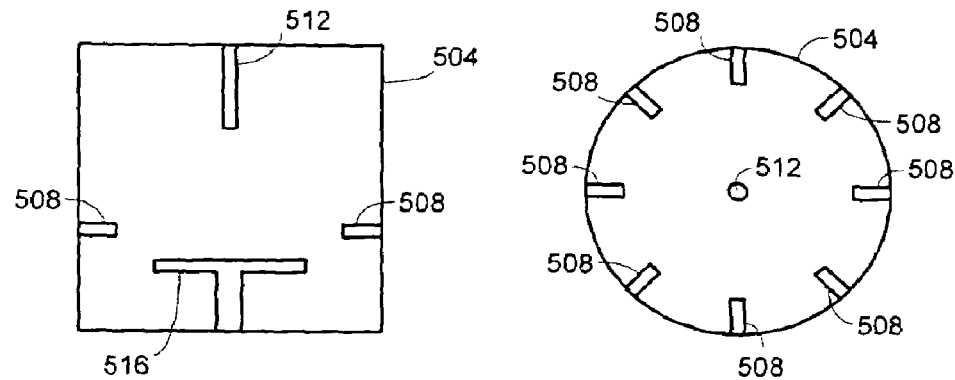
FIGS. 5A-5C provide schematic diagrams of examples of various process-chamber configurations that may be used with embodiments of the invention.

The different types of etching distributions may be effected by using the arrangement of source nozzles in the process chamber to provide differing flows of the hydrogen precursor to different parts of the chamber. Variations in the concentration of the hydrogen precursor throughout the chamber correspond inversely to the concentration of the halogen available for etching because of reactions between the hydrogen and halogen ions. Examples of different types of chamber structures that may be used to vary the hydrogen distribution through variation in hydrogen flow rates are provided in FIGS. 5A-5C. In each of these figures, the left portion of the figure shows a side view of the system while the right portion shows a top view. The structure shown in FIG. 5A includes a substrate receiving portion 516 within the process chamber 504, and has both a top gas nozzle 512 to provide a top gas source and a plurality of side gas nozzles 508 to provide a side gas source. With this type of configuration, a center-fast etch may be provided by supplying a greater flow of the hydrogen precursor to the side gas nozzles 508, thereby causing more of the halogen at the edges of the substrate to react with the hydrogen and be unavailable for etching. Conversely, an edge-fast etch may be provided by supplying a greater flow of the hydrogen precursor to the top nozzle 512, thereby causing more halogen near the center of the substrate to react with the hydrogen.

Figure 5B:
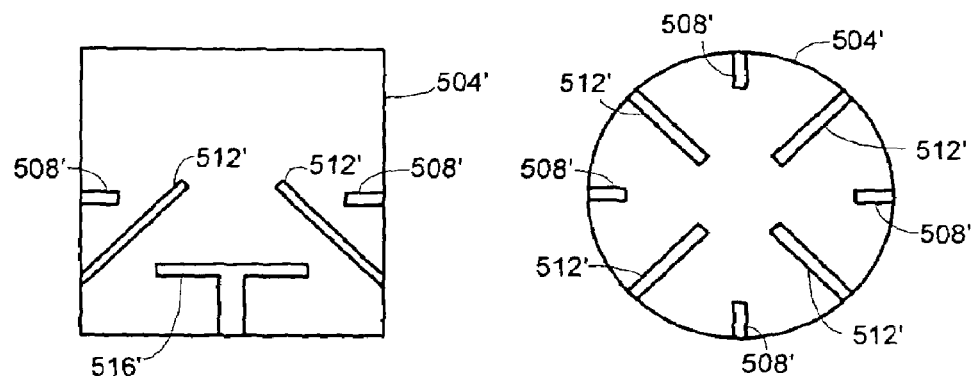
Figure 5C:
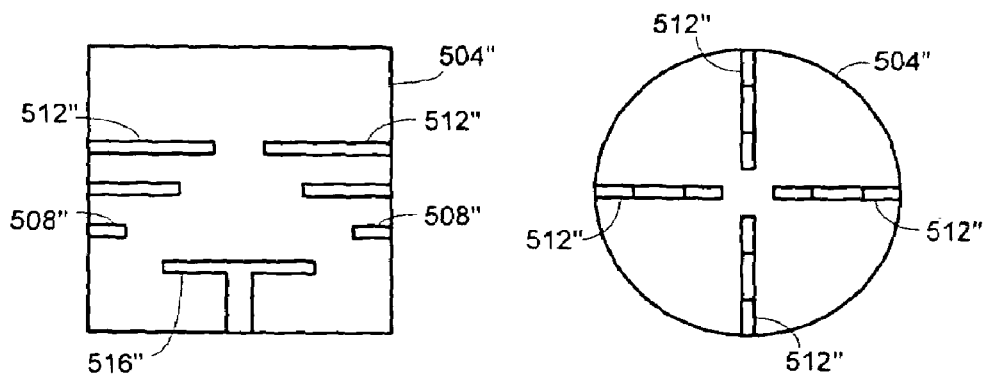

In the alternative chamber configuration shown in FIG. 5B, nozzles 512' are angled upwardly to provide a flow of gas above the substrate receiving portion 516' and side nozzles 508' provide gas flows to the side of the substrate receiving portion 516'. In still another alternative chamber configuration shown in FIG. 5C, a plurality of side nozzles are provided with varying lengths and at different heights above the substrate receiving portion 516" from short nozzles 508" to long nozzles 512". Such a nozzle configuration may also be used to provide the desired gas flow distribution by flowing hydrogen preferentially to the long nozzles 512" to provide an edge-fast etch and flowing hydrogen preferentially to the short nozzles 508" to provide a center-fast etch.

Figure 5D:
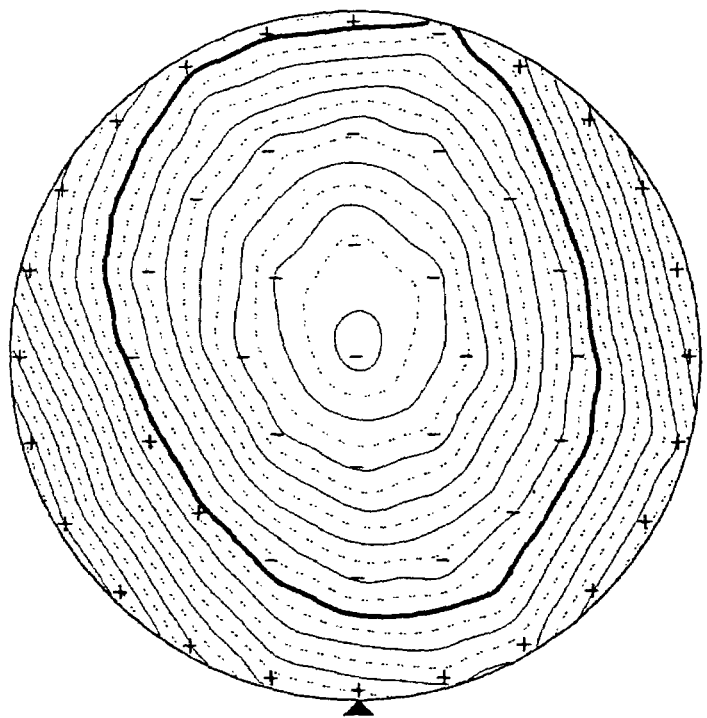
FIGS. 5D and 5E provide contour maps of the measured etch rate of a $SiO_2$ film on a Si wafer substrate with edge-fast and center-fast distributions.
Figure 5E:
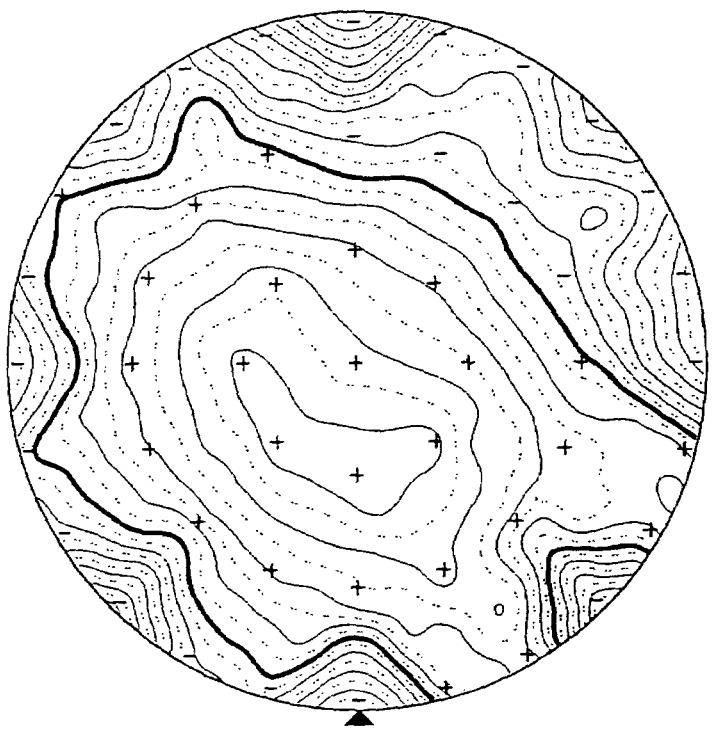

Illustrations of the effect of the edge-fast and center-fast etches in different embodiments are illustrated with FIGS. 5D and 5E. Both of these figures are contour maps of the etch rate for a 200-mm-diameter wafer having a silicon oxide on silicon layer that was etched with $NF_3$ as the halogen precursor as described above, with different flows of $H_2$. In the experiment that resulted in the contour map shown in FIG. 5D, $H_2$ was flowed preferentially at the sides of substrate receiving portion to result in a center-fast etch by decreasing the availability of fluorine atoms at the periphery of the wafer. This center-fast etching is evident from the increased thickness at the edges of the wafer when compared with the center thickness. In the experiment that resulted in the contour map shown in FIG. 5E, $H_2$ was instead flowed preferentially at the top of the substrate receiving portion to result in an edge-fast etch by decreasing the availability of fluorine atoms near the center of the wafer. This edge-fast etching is evident from the increased thickness at the center of the wafer when compared with the edge thickness.

3. Substrate Processing System

For purposes of illustration, a detailed description of one substrate processing system that may be used in implementing embodiments of the invention is described in connection with FIGS. 6A-6D. This exemplary system is an HDP-CVD system that uses a chamber having the structure shown schematically in FIG. 5A. As shown schematically in FIG. 6A, the system 610 includes a chamber 613, a vacuum system 670, a source plasma system 680A, a bias plasma system 680B, a gas delivery system 633, and a remote plasma cleaning system 650.

The upper portion of chamber 613 includes a dome 614, which is made of a ceramic dielectric material, such as aluminum oxide or aluminum nitride. Dome 614 defines an upper boundary of a plasma processing region 616. Plasma processing region 616 is bounded on the bottom by the upper surface of a substrate 617 and a substrate support member 618.

A heater plate 623 and a cold plate 624 surmount, and are thermally coupled to, dome 614. Heater plate 623 and cold plate 624 allow control of the dome temperature to within about ±10° C. over a range of about 100° C. to 200° C. This allows optimizing the dome temperature for the various processes. For example, it may be desirable to maintain the dome at a higher temperature for cleaning or etching processes than for deposition processes. Accurate control of the dome temperature also reduces the flake or particle counts in the chamber and improves adhesion between the deposited layer and the substrate.

The lower portion of chamber 613 includes a body member 622, which joins the chamber to the vacuum system. A base portion 621 of substrate support member 618 is mounted on, and forms a continuous inner surface with, body member 622. Substrates are transferred into and out of chamber 613 by a robot blade (not shown) through an insertion/removal opening (not shown) in the side of chamber 613. Lift pins (not shown) are raised and then lowered under the control of a motor (also not shown) to move the substrate from the robot blade at an upper loading position 657 to a lower processing position 656 in which the substrate is placed on a substrate receiving portion 619 of substrate support member 618. Substrate receiving portion 619 includes an electrostatic chuck 620 that secures the substrate to substrate support member 618 during substrate processing. In a preferred embodiment, substrate support member 618 is made from an aluminum oxide or aluminum ceramic material.

Vacuum system 670 includes throttle body 625, which houses twin-blade throttle valve 626 and is attached to gate valve 627 and turbo-molecular pump 628. It should be noted that throttle body 625 offers minimum obstruction to gas flow, and allows symmetric pumping. Gate valve 627 can isolate pump 628 from throttle body 625, and can also control chamber pressure by restricting the exhaust flow capacity when throttle valve 626 is fully open. The arrangement of the throttle valve, gate valve, and turbo-molecular pump allow accurate and stable control of chamber pressures from between about 1 millitorr to about 2 torr.

The source plasma system 680A includes a top coil 629 and side coil 630, mounted on dome 614. A symmetrical ground shield (not shown) reduces electrical coupling between the coils. Top coil 629 is powered by top source RF (SRF) generator 631A, whereas side coil 630 is powered by side SRF generator 631B, allowing independent power levels and frequencies of operation for each coil. This dual coil system allows control of the radial ion density in chamber 613, thereby improving plasma uniformity. Side coil 630 and top coil 629 are typically inductively driven, which does not require a complimentary electrode. In a specific embodiment, the top source RF generator 631A provides up to 2,500 watts of RF power at nominally 2 MHz and the side source RF generator 631B provides up to 5,000 watts of RF power at nominally 2 MHz. The operating frequencies of the top and side RF generators may be offset from the nominal operating frequency (e.g. to 1.7-1.9 MHz and 1.9-2.1 MHz, respectively) to improve plasma-generation efficiency.

A bias plasma system 780B includes a bias RF ("BRF") generator 631C and a bias matching network 632C. The bias plasma system 680B capacitively couples substrate portion 617 to body member 622, which act as complimentary electrodes. The bias plasma system 680B serves to enhance the transport of plasma species (e.g., ions) created by the source plasma system 680A to the surface of the substrate. In a specific embodiment, bias RF generator provides up to 5,000 watts of RF power at 13.56 MHz.

RF generators 631A and 631B include digitally controlled synthesizers and operate over a frequency range between about 1.8 to about 2.1 MHz. Each generator includes an RF control circuit (not shown) that measures reflected power from the chamber and coil back to the generator and adjusts the frequency of operation to obtain the lowest reflected power, as understood by a person of ordinary skill in the art. RF generators are typically designed to operate into a load with a characteristic impedance of 50 ohms. RF power may be reflected from loads that have a different characteristic impedance than the generator. This can reduce power transferred to the load. Additionally, power reflected from the load back to the generator may overload and damage the generator. Because the impedance of a plasma may range from less than 5 ohms to over 900 ohms, depending on the plasma ion density, among other factors, and because reflected power may be a function of frequency, adjusting the generator frequency according to the reflected power increases the power transferred from the RF generator to the plasma and protects the generator. Another way to reduce reflected power and improve efficiency is with a matching network.

Matching networks 632A and 632B match the output impedance of generators 631A and 631B with their respective coils 629 and 630. The RF control circuit may tune both matching networks by changing the value of capacitors within the matching networks to match the generator to the load as the load changes. The RF control circuit may tune a matching network when the power reflected from the load back to the generator exceeds a certain limit. One way to provide a constant match, and effectively disable the RF control circuit from tuning the matching network, is to set the reflected power limit above any expected value of reflected power. This may help stabilize a plasma under some conditions by holding the matching network constant at its most recent condition.

Other measures may also help stabilize a plasma. For example, the RF control circuit can be used to determine the power delivered to the load (plasma) and may increase or decrease the generator output power to keep the delivered power substantially constant during deposition of a layer.

Figure 6A:
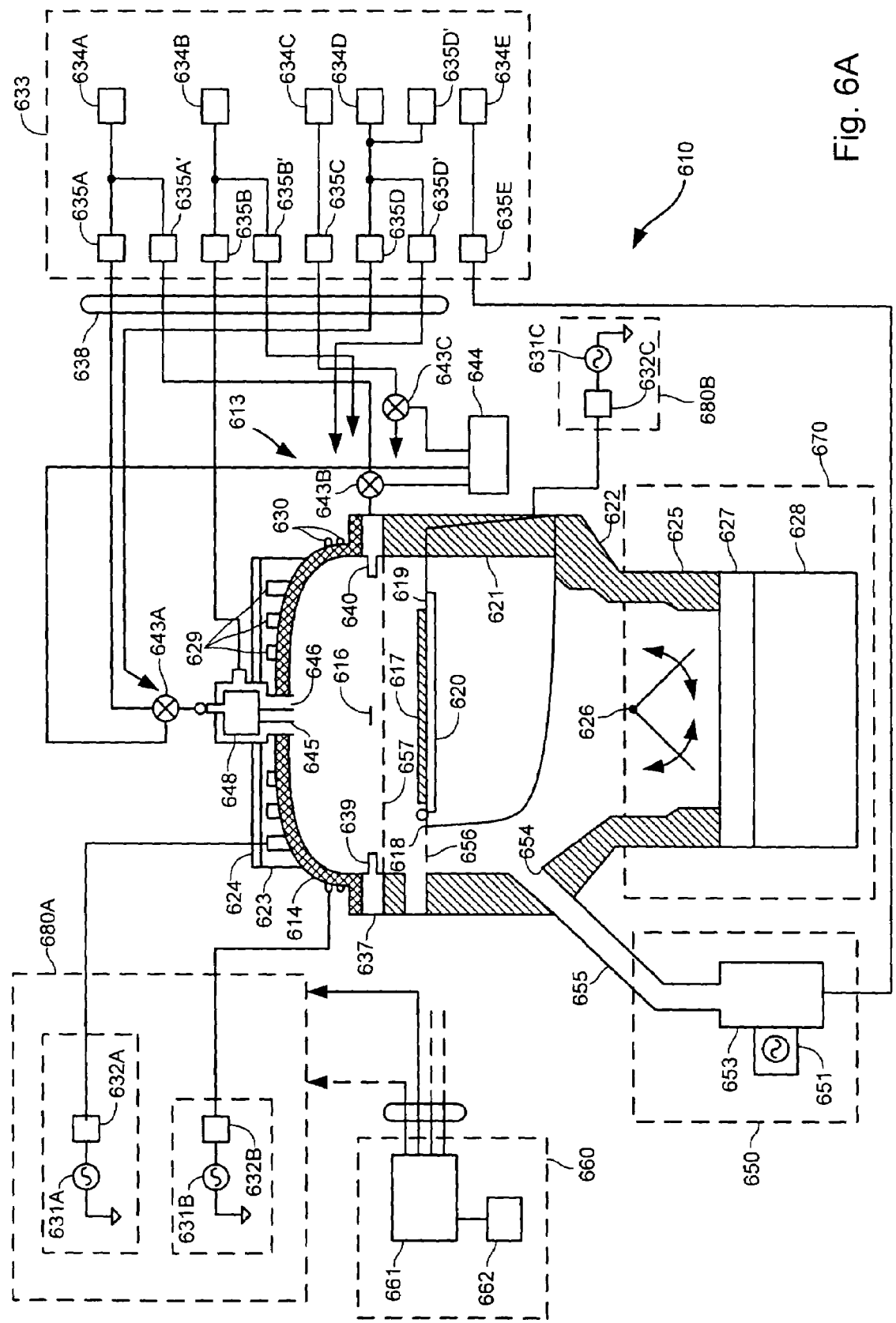
FIG. 6A is a simplified diagram of one embodiment of a high-density plasma chemical vapor deposition system according to the present invention.
Figure 6B:
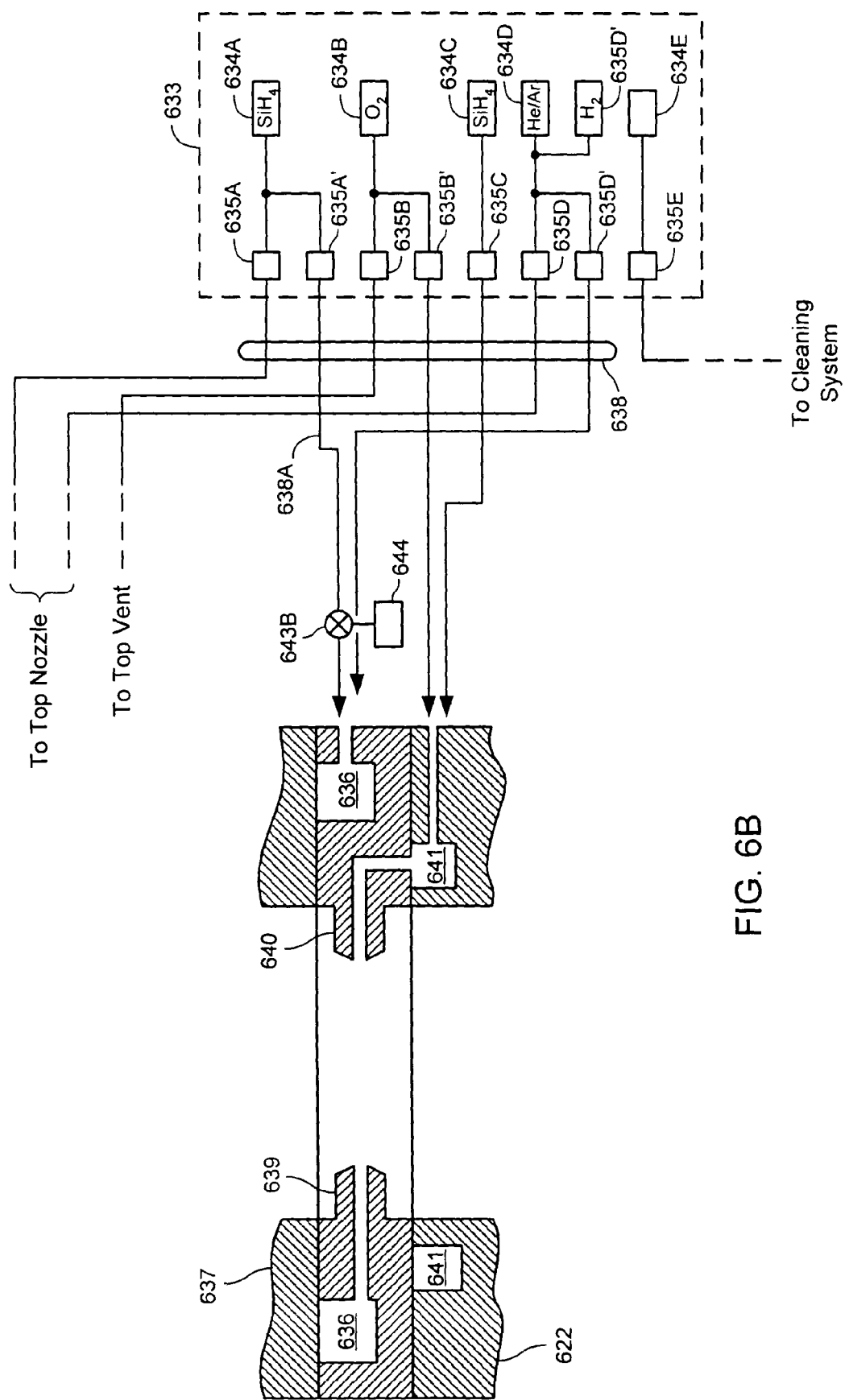
FIG. 6B is a simplified cross section of a gas ring that may be used in conjunction with the exemplary CVD processing chamber of FIG. 6A.

A gas delivery system 633 provides gases from several sources, 634A-634E chamber for processing the substrate via gas delivery lines 638 (only some of which are shown). As would be understood by a person of skill in the art, the actual sources used for sources 634A-634E and the actual connection of delivery lines 638 to chamber 613 varies depending on the deposition and cleaning processes executed within chamber 613. Gases are introduced into chamber 613 through a gas ring 637 and/or a top nozzle 645. FIG. 6B is a simplified, partial cross-sectional view of chamber 613 showing additional details of gas ring 637.

In one embodiment, first and second gas sources, 634A and 634B, and first and second gas flow controllers, 635A' and 635B', provide gas to ring plenum 636 in gas ring 637 via gas delivery lines 638 (only some of which are shown). Gas ring 637 has a plurality of source gas nozzles 639 (only one of which is shown for purposes of illustration) that provide a uniform flow of gas over the substrate. Nozzle length and nozzle angle may be changed to allow tailoring of the uniformity profile and gas utilization efficiency for a particular process within an individual chamber. In a preferred embodiment, gas ring 637 has twelve source gas nozzles made from an aluminum oxide ceramic.

Gas ring 637 also has a plurality of oxidizer gas nozzles 640 (only one of which is shown), which in a preferred embodiment are co-planar with and shorter than source gas nozzles 639, and in one embodiment receive gas from body plenum 641. In some embodiments it is desirable not to mix source gases and oxidizer gases before injecting the gases into chamber 613. In other embodiments, oxidizer gas and source gas may be mixed prior to injecting the gases into chamber 613 by providing apertures (not shown) between body plenum 641 and gas ring plenum 636. In one embodiment, third, fourth, and fifth gas sources, 634C, 634D, and 634D', and third and fourth gas flow controllers, 635C and 635D', provide gas to body plenum via gas delivery lines 638. Additional valves, such as 643B (other valves not shown), may shut off gas from the flow controllers to the chamber.

In embodiments where flammable, toxic, or corrosive gases are used, it may be desirable to eliminate gas remaining in the gas delivery lines after a deposition. This may be accomplished using a 3-way valve, such as valve 643B, to isolate chamber 613 from delivery line 638A and to vent delivery line 638A to vacuum foreline 644, for example. As shown in FIG. 6A, other similar valves, such as 643A and 643C, may be incorporated on other gas delivery lines. Such three-way valves may be placed as close to chamber 613 as practical, to minimize the volume of the unvented gas delivery line (between the three-way valve and the chamber). Additionally, two-way (on-off) valves (not shown) may be placed between a mass flow controller ("MFC") and the chamber or between a gas source and an MFC.

Referring again to FIG. 6A, chamber 613 also has top nozzle 645 and top vent 646. Top nozzle 645 and top vent 646 allow independent control of top and side flows of the gases, which improves film uniformity and allows fine adjustment of the film's deposition and doping parameters. Top vent 646 is an annular opening around top nozzle 645. In one embodiment, first gas source 634A supplies source gas nozzles 639 and top nozzle 645. Source nozzle MFC 635A' controls the amount of gas delivered to source gas nozzles 639 and top nozzle MFC 635A controls the amount of gas delivered to top gas nozzle 645. Similarly, two MFCs 635B and 635B' may be used to control the flow of oxygen to both top vent 646 and oxidizer gas nozzles 640 from a single source of oxygen, such as source 634B. The gases supplied to top nozzle 645 and top vent 646 may be kept separate prior to flowing the gases into chamber 613, or the gases may be mixed in top plenum 648 before they flow into chamber 613. Separate sources of the same gas may be used to supply various portions of the chamber.

A remote microwave-generated plasma cleaning system 650 is provided to periodically clean deposition residues from chamber components. The cleaning system includes a remote microwave generator 651 that creates a plasma from a cleaning gas source 634E (e.g., molecular fluorine, nitrogen trifluoride, other fluorocarbons or equivalents) in reactor cavity 653. The reactive species resulting from this plasma are conveyed to chamber 613 through cleaning gas feed port 654 via applicator tube 655. The materials used to contain the cleaning plasma (e.g., cavity 653 and applicator tube 655) must be resistant to attack by the plasma. The distance between reactor cavity 653 and feed port 654 should be kept as short as practical, since the concentration of desirable plasma species may decline with distance from reactor cavity 653. Generating the cleaning plasma in a remote cavity allows the use of an efficient microwave generator and does not subject chamber components to the temperature, radiation, or bombardment of the glow discharge that may be present in a plasma formed in situ. Consequently, relatively sensitive components, such as electrostatic chuck 620, do not need to be covered with a dummy wafer or otherwise protected, as may be required with an in situ plasma cleaning process. In one embodiment, this cleaning system is used to dissociate atoms of the etchant gas remotely, which are then supplied to the process chamber 613. In another embodiment, the etchant gas is provided directly to the process chamber 613. In still a further embodiment, multiple process chambers are used, with deposition and etching steps being performed in separate chambers.

System controller 660 controls the operation of system 610. In a preferred embodiment, controller 660 includes a memory 662, such as a hard disk drive, a floppy disk drive (not shown), and a card rack (not shown) coupled to a processor 661. The card rack may contain a single-board computer (SBC) (not shown), analog and digital input/output boards (not shown), interface boards (not shown), and stepper motor controller boards (not shown). The system controller conforms to the Versa Modular European ("VME") standard, which defines board, card cage, and connector dimensions and types. The VME standard also defines the bus structure as having a 16-bit data bus and 24-bit address bus. System controller 631 operates under the control of a computer program stored on the hard disk drive or through other computer programs, such as programs stored on a removable disk. The computer program dictates, for example, the timing, mixture of gases, RF power levels and other parameters of a particular process. The interface between a user and the system controller is via a monitor, such as a cathode ray tube ("CRT") 665, and a light pen 666, as depicted in FIG. 6C.

Figure 6C:
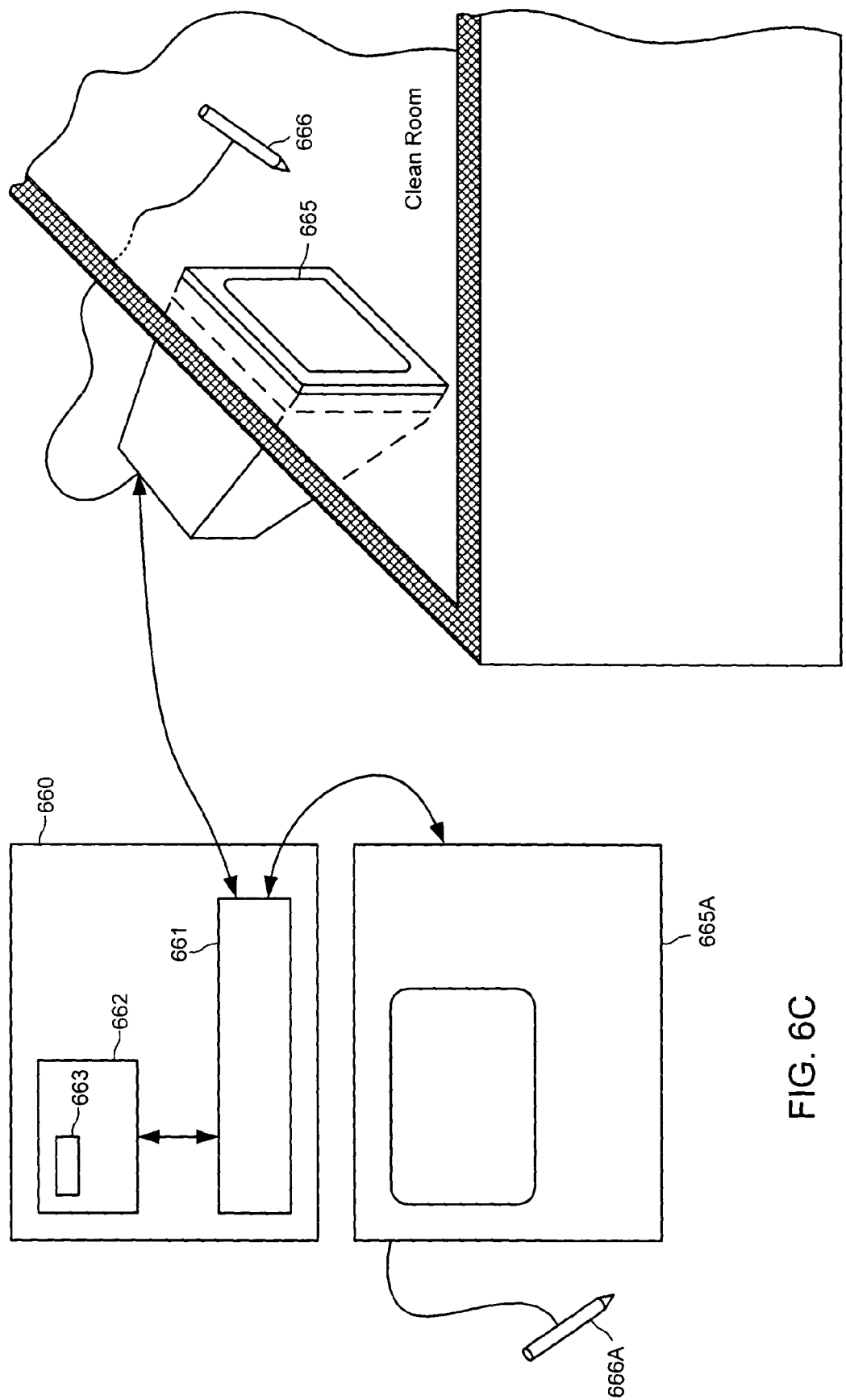
FIG. 6C is a simplified diagram of a monitor and light pen that may be used in conjunction with the exemplary CVD processing chamber of FIG. 6A.

FIG. 6C is an illustration of a portion of an exemplary system user interface used in conjunction with the exemplary CVD processing chamber of FIG. 6A. System controller 660 includes a processor 661 coupled to a computer-readable memory 662. Preferably, memory 662 may be a hard disk drive, but memory 662 may be other kinds of memory, such as ROM, PROM, and others.

System controller 660 operates under the control of a computer program 663 stored in a computer-readable format within memory 662. The computer program dictates the timing, temperatures, gas flows, RF power levels and other parameters of a particular process. The interface between a user and the system controller is via a CRT monitor 665 and a light pen 666, as depicted in FIG. 6C. In a preferred embodiment, two monitors, 665 and 665A, and two light pens, 666 and 666A, are used, one mounted in the clean room wall (665) for the operators and the other behind the wall (665A) for the service technicians. Both monitors simultaneously display the same information, but only one light pen (e.g. 666) is enabled. To select a particular screen or function, the operator touches an area of the display screen and pushes a button (not shown) on the pen. The touched area confirms being selected by the light pen by changing its color or displaying a new menu, for example.

The computer program code can be written in any conventional computer-readable programming language such as 68000 assembly language, C, C++, or Pascal. Suitable program code is entered into a single file, or multiple files, using a conventional text editor and is stored or embodied in a computer-usable medium, such as a memory system of the computer. If the entered code text is in a high level language, the code is compiled, and the resultant compiler code is then linked with an object code of precompiled windows library routines. To execute the linked compiled object code, the system user invokes the object code causing the computer system to load the code in memory. The CPU reads the code from memory and executes the code to perform the tasks identified in the program.

Figure 6D:
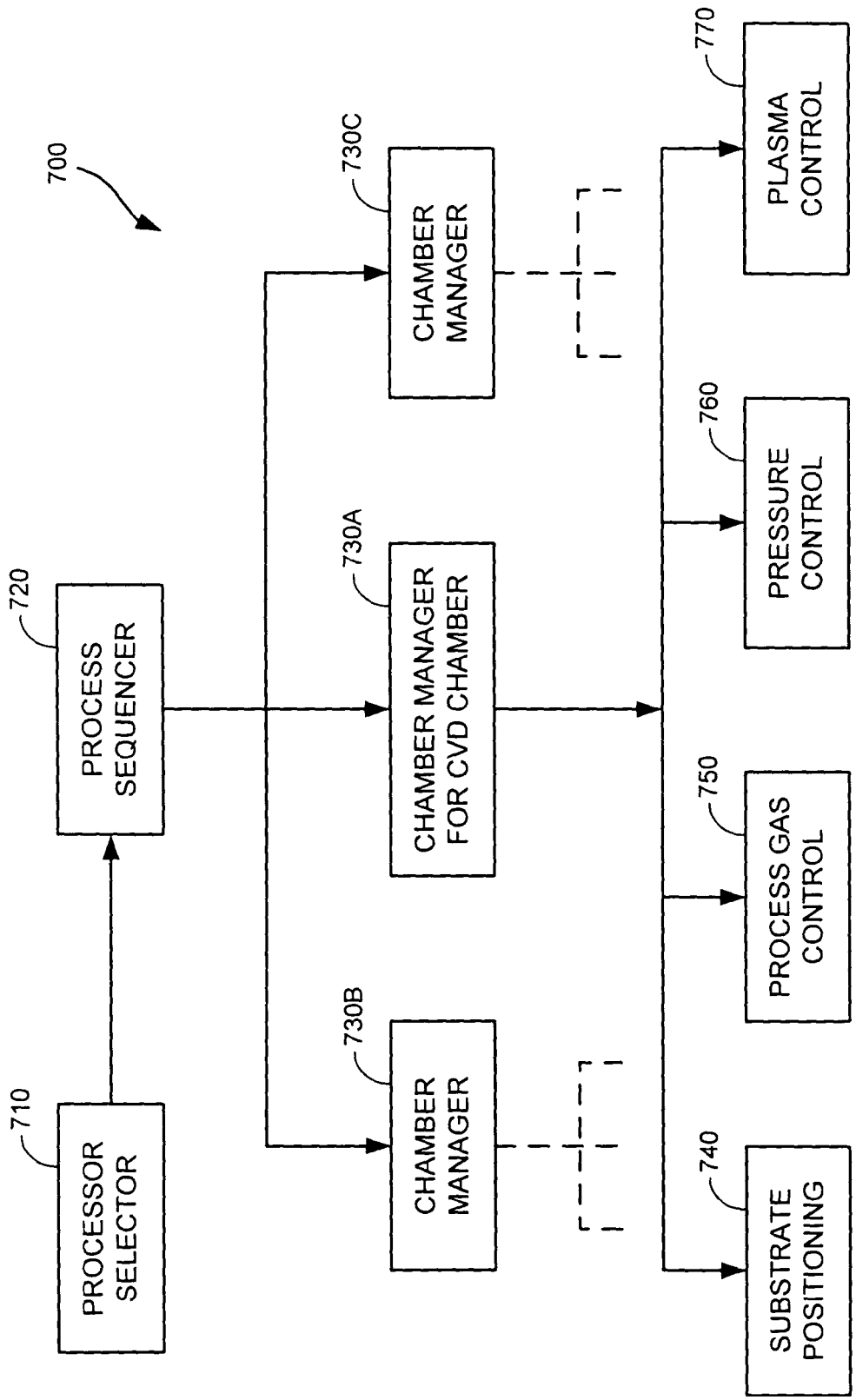
FIG. 6D is a flow chart of an exemplary process control computer program product used to control the exemplary CVD processing chamber of FIG. 6A.

FIG. 6D shows an illustrative block diagram of the hierarchical control structure of computer program 700. A user enters a process set number and process chamber number into a process selector subroutine 710 in response to menus or screens displayed on the CRT monitor by using the light pen interface. The process sets are predetermined sets of process parameters necessary to carry out specified processes, and are identified by predefined set numbers. Process selector subroutine 710 identifies (i) the desired process chamber in a multichamber system, and (ii) the desired set of process parameters needed to operate the process chamber for performing the desired process. The process parameters for performing a specific process relate to conditions such as process gas composition and flow rates, temperature, pressure, plasma conditions such as RF power levels, and chamber dome temperature, and are provided to the user in the form of a recipe. The parameters specified by the recipe are entered utilizing the light pen/CRT monitor interface.

The signals for monitoring the process are provided by the analog and digital input boards of system controller 660, and the signals for controlling the process are output on the analog and digital output boards of system controller 660.

A process sequencer subroutine 720 comprises program code for accepting the identified process chamber and set of process parameters from the process selector subroutine 710 and for controlling operation of the various process chambers. Multiple users can enter process set numbers and process chamber numbers, or a single user can enter multiple process set numbers and process chamber numbers; sequencer subroutine 720 schedules the selected processes in the desired sequence. Preferably, sequencer subroutine 720 includes a program code to perform the steps of (i) monitoring the operation of the process chambers to determine if the chambers are being used, (ii) determining what processes are being carried out in the chambers being used, and (iii) executing the desired process based on availability of a process chamber and type of process to be carried out. Conventional methods of monitoring the process chambers can be used, such as polling. When scheduling which process is to be executed, sequencer subroutine 720 can be designed to take into consideration the "age" of each particular user-entered request, or the present condition of the process chamber being used in comparison with the desired process conditions for a selected process, or any other relevant factor a system programmer desires to include for determining scheduling priorities.

After sequencer subroutine 720 determines which process chamber and process set combination is going to be executed next, sequencer subroutine 720 initiates execution of the process set by passing the particular process set parameters to a chamber manager subroutine 730A-730C, which controls multiple processing tasks in chamber 613 and possibly other chambers (not shown) according to the process set sent by sequencer subroutine 720.

Examples of chamber component subroutines are substrate positioning subroutine 740, process gas control subroutine 750, pressure control subroutine 760, and plasma control subroutine 770. Those having ordinary skill in the art will recognize that other chamber control subroutines can be included depending on what processes are selected to be performed in chamber 613. In operation, chamber manager subroutine 730A selectively schedules or calls the process component subroutines in accordance with the particular process set being executed. Chamber manager subroutine 730A schedules process component subroutines in the same manner that sequencer subroutine 720 schedules the process chamber and process set to execute. Typically, chamber manager subroutine 730A includes steps of monitoring the various chamber components, determining which components need to be operated based on the process parameters for the process set to be executed, and causing execution of a chamber component subroutine responsive to the monitoring and determining steps.

Operation of particular chamber component subroutines will now be described with reference to FIGS. 6A and 6D. Substrate positioning subroutine 740 comprises program code for controlling chamber components that are used to load a substrate onto substrate support number 618. Substrate positioning subroutine 740 may also control transfer of a substrate into chamber 613 from, e.g., a plasma-enhanced CVD ("PECVD") reactor or other reactor in the multi-chamber system, after other processing has been completed.

Process gas control subroutine 750 has program code for controlling process gas composition and flow rates. Subroutine 750 controls the open/close position of the safety shut-off valves and also ramps up/ramps down the mass flow controllers to obtain the desired gas flow rates. All chamber component subroutines, including process gas control subroutine 750, are invoked by chamber manager subroutine 730A. Subroutine 750 receives process parameters from chamber manager subroutine 730A related to the desired gas flow rates.

Typically, process gas control subroutine 750 opens the gas supply lines, and repeatedly (i) reads the necessary mass flow controllers, (ii) compares the readings to the desired flow rates received from chamber manager subroutine 730A, and (iii) adjusts the flow rates of the gas supply lines as necessary. Furthermore, process gas control subroutine 750 may include steps for monitoring the gas flow rates for unsafe rates and for activating the safety shut-off valves when an unsafe condition is detected.

In some processes, an inert gas, such as argon, is flowed into chamber 613 to stabilize the pressure in the chamber before reactive process gases are introduced. For these processes, the process gas control subroutine 750 is programmed to include steps for flowing the inert gas into chamber 613 for an amount of time necessary to stabilize the pressure in the chamber. The steps described above may then be carried out.

Additionally, when a process gas is to be vaporized from a liquid precursor, for example, tetraethylorthosilane (TEOS), the process gas control subroutine 750 may include steps for bubbling a delivery gas such as helium through the liquid precursor in a bubbler assembly or for introducing the helium to a liquid injection valve. For this type of process, the process gas control subroutine 750 regulates the flow of the delivery gas, the pressure in the bubbler, and the bubbler temperature to obtain the desired process gas flow rates. As discussed above, the desired process gas flow rates are transferred to process gas control subroutine 750 as process parameters.

Furthermore, the process gas control subroutine 750 includes steps for obtaining the necessary delivery gas flow rate, bubbler pressure, and bubbler temperature for the desired process gas flow rate by accessing a stored table containing the necessary values for a given process gas flow rate. Once the necessary values are obtained, the delivery gas flow rate, bubbler pressure and bubbler temperature are monitored, compared to the necessary values and adjusted accordingly.

The process gas control subroutine 750 may also control the flow of heat-transfer gas, such as helium (He), through the inner and outer passages in the wafer chuck with an independent helium control (IHC) subroutine (not shown). The gas flow thermally couples the substrate to the chuck. In a typical process, the wafer is heated by the plasma and the chemical reactions that form the layer, and the He cools the substrate through the chuck, which may be water-cooled. This keeps the substrate below a temperature that may damage preexisting features on the substrate.

Pressure control subroutine 760 includes program code for controlling the pressure in chamber 613 by regulating the size of the opening of throttle valve 626 in the exhaust portion of the chamber. There are at least two basic methods of controlling the chamber with the throttle valve. The first method relies on characterizing the chamber pressure as it relates to, among other things, the total process gas flow, the size of the process chamber, and the pumping capacity. The first method sets throttle valve 626 to a fixed position. Setting throttle valve 626 to a fixed position may eventually result in a steady-state pressure.

Alternatively, the chamber pressure may be measured, with a manometer for example, and the position of throttle valve 626 may be adjusted according to pressure control subroutine 760, assuming the control point is within the boundaries set by gas flows and exhaust capacity. The former method may result in quicker chamber pressure changes, as the measurements, comparisons, and calculations associated with the latter method are not invoked. The former method may be desirable where precise control of the chamber pressure is not required, whereas the latter method may be desirable where an accurate, repeatable, and stable pressure is desired, such as during the deposition of a layer.

When pressure control subroutine 760 is invoked, the desired, or target, pressure level is received as a parameter from chamber manager subroutine 730A. Pressure control subroutine 760 measures the pressure in chamber 613 by reading one or more conventional pressure manometers connected to the chamber; compares the measured value(s) to the target pressure; obtains proportional, integral, and differential (PID) values from a stored pressure table corresponding to the target pressure, and adjusts throttle valve 626 according to the PID values obtained from the pressure table. Alternatively, pressure control subroutine 760 may open or close throttle valve 626 to a particular opening size to regulate the pressure in chamber 613 to a desired pressure or pressure range.

Plasma control subroutine 770 comprises program code for controlling the frequency and power output setting of RF generators 631A and 631B and for tuning matching networks 632A and 632B. Plasma control subroutine 770, like the previously described chamber component subroutines, is invoked by chamber manager subroutine 730A.

An example of a system that may incorporate some or all of the subsystems and routines described above would be the ULTIMA™ system, manufactured by APPLIED MATERIALS, INC., of Santa Clara, Calif., configured to practice the present invention. Further details of such a system are disclosed in commonly assigned U.S. Pat. No. 6,170,428, filed Jul. 15, 1996, entitled "Symmetric Tunable Inductively-Coupled HDP-CVD Reactor," having Fred C. Redeker, Farhad Moghadam, Hirogi Hanawa, Tetsuya Ishikawa, Dan Maydan, Shijian Li, Brian Lue, Robert Steger, Yaxin Wang, Manus Wong and Ashok Sinha listed as co-inventors, the disclosure of which is incorporated herein by reference. The described system is for exemplary purpose only. It would be a matter of routine skill for a person of skill in the art to select an appropriate conventional substrate processing system and computer control system to implement the present invention.

4. EXAMPLE

Figure 7:
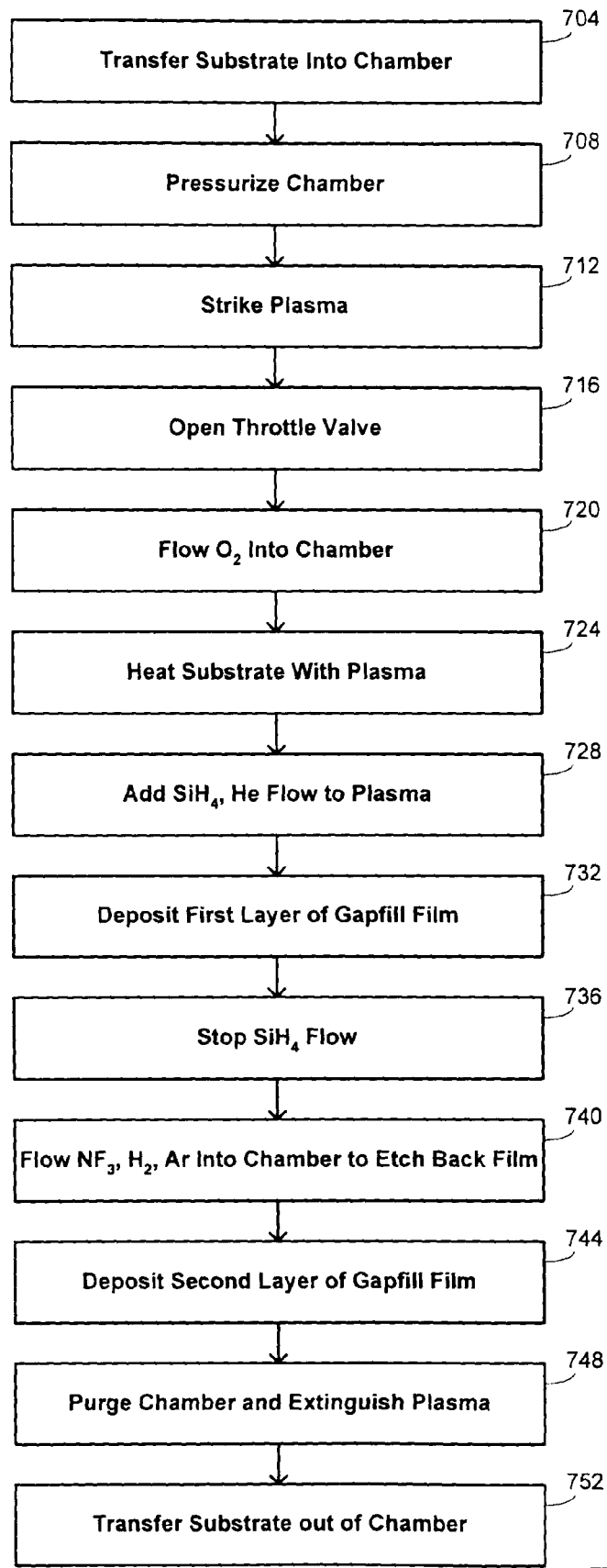
FIG. 7 is a flow diagram illustrating an exemplary process for depositing a silicate glass film in an embodiment of the invention.

FIG. 7 provides a flowchart depicting the steps associated with deposition of a silicate glass film according to one specific embodiment of the invention as implemented in the exemplary chamber described with respect to FIGS. 6A-6D. The process depicted in FIG. 7 begins by transferring a substrate into the substrate processing chamber 613 at block 204. Next, argon is flowed into the chamber 613 at block 208 with the throttle valve 626 in a closed position to pressurize the chamber 613 in preparation for striking a plasma. Once the pressure has reached a sufficient level, a plasma is formed at block 212 by applying RF power to top coil 629. The throttle valve is partially opened at block 216 and RF power is applied to side coil 630.

A flow of oxygen is then added to the argon flow at block 220 and the throttle valve 626 is fully opened so that the chamber pressure is set entirely by the rate at which gases are introduced into the chamber 613. As indicated at block 224, the plasma is then maintained with flows of oxygen and argon in order to heat the substrate prior to initiating deposition of the silicate glass film. In some embodiments, the heating at block 224 heats the substrate to a temperature greater than 400° C. and, in some embodiments, to a temperature greater than 500° C. Typically, the heating at block 224 uses source RF power only, i.e. with no bias RF power, to ensure that underlying substrate features are not sputtered during heating. Also, in some embodiments, the substrate may not be chucked to the substrate support member 618 during the heating but is instead is thermally floating.

Once the substrate reaches a sufficient temperature, the substrate is chucked to the substrate support 618 and a flow of silane is added to the oxygen and argon flows at block 228 to initiate the silicate glass deposition. At block 232, the argon flow is stopped, the flow rates of the silane and oxygen are increased to level optimized for gapfill capabilities during the deposition of the first portion 258 of the silicate glass film, and bias power is applied to the pedestal. Some embodiments of the invention exclude a flow of argon from the deposition gas at block 228 to minimize sidewall redeposition that contributes to closing of the gap as discussed above. Other embodiments add a flow of hydrogen and/or helium to the process gas to further improve gapfill capabilities as noted above.

Deposition of the first portion 258 of the silicate glass film is stopped after a predetermined time by stopping the flow of the silane source as indicated at block 236. In a continuous in situ process, the etching phase is initiated at block 240 by flowing $NF_3$, $H_2$, and Ar into the chamber. Chamber pressure may be increased to enable a higher etch rate, and the substrate may be allowed to cool prior to etching to provide greater control over the etching. As previously noted, the inclusion of $H_2$ in the etchant gas permits a reduction in the etch rate of the process to a more controllable rate. In addition, it reduces the number of particles generated during the etch process and subsequent deposition process and may also improve the uniformity of the etch process so that fewer etch defects in the form of silicon-rich pockets are formed on the surface of the etched substrate.

The etch phase of the process widens the entry to the gap while also reducing the height of material deposited over the surfaces surrounding the gap, enabling the second portion of the gapfill layer to be deposited at block 244. A transition back to a deposition phase in a continuous in situ process may be made by increasing the RF power levels applied to the top and side coils 129 and 130, and replacing the flows of $NF_3$ and $H_2$ with a flow of $SiH_4$. After deposition of the second portion of the film, the chamber 213 is purged, the plasma is extinguished, and the substrate is dechucked at block 248. With deposition of the film completed, the substrate is transferred out of the chamber at block 252 altogether. Depending on the height of the gap to be filled as well as on the width of the gap and its profile, e.g., whether it has a reentrant profile, additional etch and deposition sequences may be repeated one or more times as necessary prior to depositing the top portion.

Table I below lists process parameters according to an embodiment implemented in the ULTIMA™ HDP-CVD chamber manufactured for Applied Materials and outfitted for 200-mm substrates. The gas flow rates and other parameters are set forth in Table I are optimized for a deposition process run in the ULTIMA™ chamber. A person of ordinary skill in the art will recognize that these rates and parameters are in part chamber specific and will vary if chambers of other design and/or volume are employed.

| Parameter | Exemplary Ranges for Process Parameters | | |
|---|---|---|---|
| | First Deposition | Etch | Second Deposition |
| Top RF Power (1.8 MHz) [W] | 3000-5100 | 500-5000 | 3000-5100 |
| Side RF Power (2.1 MHz) [W] | 3000-4800 | 500-5000 | 3000-4800 |
| Bias RF Power (13.56 MHz) [W] | 600-4000 | 100-3000 | 600-4000 |
| $SiH_4$ flow [sccm] | 20-160 | — | 20-160 |
| $O_2$ flow [sccm] | (1.4-2.2) × $SiH_4$ flow | 0-1000 | (1.4-2.2) × $SiH_4$ flow |
| Ar flow [sccm] | 0-160 | 0-1000 | 0-160 |
| $NF_3$ flow [sccm] | — | 10-1000 | — |
| $H_2$ flow [sccm] | 0-160 | 50-500 | 0-160 |
| Pressure (mtorr) | 1.5-6.0 | 25-100 | 1.5-6.0 |

Having fully described several embodiments of the present invention, many other equivalents and alternative embodiments will be apparent to those skilled in the art. For example, while the invention has been described mast specifically for deposition of an undoped silicate glass layer, the invention may also be used to improve the gapfill capabilities of a variety of doped silicate glasses by adding flows comprising appropriate dopants in one or more of the deposition phases. Also, in other embodiments, an oxygen source such as $N_2O$ or $CO_2$ may be used instead of $O_2$ and a silicon source other than monosilane may be used. Examples of suitable silicon sources include other silanes such as $Si_2H_6$, $Si_3H_8$, etc., as well as TEOS or $SiF_4$, among others. In still other embodiments, the etching may be performed by introducing remotely dissociated etchant atoms into the chamber. For example, in one embodiment, a fluorine etchant gas may be flowed into the remote plasma system 650 so that remotely dissociated fluorine ions formed within the remote system 650 may be transported to the HDP-CVD chamber to perform the etching. Also, as previously noted, although the description has focused on an HDP-CVD process for exemplary purposes, the techniques described herein may more generally be used with any gapfill process that produces asymmetric deposition. These and other equivalents and alternatives are intended to be included within the scope of the present invention.

What is claimed is:

1. A method for depositing a film on a substrate disposed in a substrate processing chamber, the substrate having a trench formed between adjacent raised surfaces, the method comprising:
   depositing a first portion of the film over the substrate from a first gaseous mixture flowed into the processing chamber by chemical-vapor deposition;
   thereafter, etching the first portion by flowing an etchant gas comprising a halogen precursor, a hydrogen precursor, and an oxygen precursor into the process chamber, with halogen precursor being flowed into the processing chamber at a flow rate between 10 and 1000 sccm and the hydrogen precursor being flowed into the processing chamber at a flow rate between 50 sccm and 500 sccm to control chemical interaction between the halogen precursor and the hydrogen precursor to provide a desired etch rate; and
   thereafter, depositing a second portion of the silicate glass film over the substrate from a second gaseous mixture flowed into the processing chamber by chemical-vapor deposition.

2. The method recited in claim 1 wherein the hydrogen precursor comprises $H_2$.

3. The method recited in claim 1 wherein the halogen precursor comprises a fluorine precursor.

4. The method recited in claim 3 wherein the fluorine precursor comprises $NF_3$.

5. The method recited in claim 4 wherein:
   the substrate includes a silicon nitride layer; and
   etching the first portion comprises adjusting a flow rate of the hydrogen precursor and a flow rate of the $NF_3$ to control a relative concentration of NO and F in the processing chamber.

6. The method recited in claim 3 wherein the fluorine precursor comprises $F_2$.

7. The method recited in claim 3 wherein the fluorine precursor comprises $SiF_4$.

8. The method recited in claim 1 wherein the hydrogen precursor and the oxygen precursor are comprised by a single compound.

9. The method recited in claim 8 wherein the single compound is $H_2O$.

10. The method recited in claim 8 wherein the single compound is $H_2O_2$.

11. The method recited in claim 1 wherein etching the first portion comprises maintaining a plasma formed from the etchant gas.

12. The method recited in claim 11 wherein the plasma is a high-density plasma.

13. The method recited in claim 11 wherein the etchant gas further comprises an inert sputtering agent.

14. The method recited in claim 13 wherein the inert sputtering agent comprises Ar.

15. The method recited in claim 13 wherein the inert sputtering agent comprises He.

16. The method recited in claim 13 wherein etching the first portion is performed with a sputter/removal ratio between 0.0 and 0.8, the sputter/removal ratio corresponding to a ratio of a volume of material removed by sputtering to a total volume of material removed by a combination of sputtering and chemical etching.

17. The method recited in claim 11 wherein:
   depositing the first portion of the film comprises maintaining a plasma formed from the first gaseous mixture; and
   depositing the second portion of the film comprises maintaining a plasma formed from the second gaseous mixture.

18. The method recited in claim 11 further comprising biasing the plasma towards the substrate.

19. The method recited in claim 1 wherein etching the first portion comprises flowing the hydrogen precursor at different flow rates to different parts of the processing chamber to effect a radially nonuniform etching distribution over the substrate.

20. A method for depositing a silicate glass film on a substrate disposed in a substrate processing chamber, the substrate having a trench formed between adjacent raised surfaces, the method comprising:
   depositing a first portion of the silicate glass film over the substrate by forming a plasma from a first gaseous mixture flowed into the processing chamber, the first gaseous mixture comprising a silicon-containing gas and an oxygen-containing gas;
   thereafter, etching the first portion by forming a plasma from an etchant gas mixture flowed into the processing chamber, the etchant gas mixture comprising a fluorine-containing gas, $H_2$, and $O_2$, wherein the fluorine-containing gas is flowed into the processing chamber at a flow rate between 10 and 1000 sccm and the $H_2$ is flowed into the processing chamber at a flow rate between 50 sccm and 500 sccm; and
   thereafter, depositing a second portion of the silicate glass film over the substrate by forming a plasma from a second gaseous mixture flowed into the processing chamber, the second gaseous mixture comprising the silicon-containing gas and the oxygen-containing gas.

21. The method recited in claim 20 wherein the fluorine-containing gas comprises $NF_3$.

22. The method recited in claim 21 wherein:
   the substrate includes a silicon nitride layer; and
   etching the first portion comprises adjusting flow rates of the $NF_3$, $H_2$, and $O_2$ to control a relative concentration of NO and F in the processing chamber.

23. The method recited in claim 20 wherein the etchant gas mixture further comprises an inert sputtering agent.

24. The method recited in claim 20 wherein etching the first portion further comprises biasing the plasma formed from the etchant gas towards the substrate.

25. The method recited in claim 20 wherein etching the first portion comprises flowing the $H_2$ at different flow rates to different parts of the processing chamber to effect a radially nonuniform etching distribution over the substrate.

26. A method for depositing a silicate glass film on a substrate disposed in a substrate processing chamber, the substrate having a trench formed between adjacent raised surfaces, the method comprising:
   depositing a first portion of the film over the substrate by forming a plasma from a first gaseous mixture flowed into the processing chamber;
   thereafter, etching the first portion by forming a plasma from an etchant gas mixture flowed into the processing chamber, the etchant gas mixture comprising a first precursor gas reactive with the film, a second precursor gas reactive with the first precursor gas, and an inert sputtering agent flowed into the processing chamber, with the first precursor gas being flowed into the processing chamber at a flow rate between 10 and 1000 sccm and second precursor gas being flowed at a flow rate between 50 sccm and 500 sccm to control chemical interaction between the first and second precursor gases to provide a desired etch rate, and with the inert sputtering agent flowed at a respective flow rate to control relative isotropic and anisotropic contributions to the etching; and thereafter, depositing a second portion of the silicate glass film by forming a plasma from a second gaseous mixture.

27. The method recited in claim 26 wherein etching the first portion further comprises biasing the plasma formed from the etchant gas towards the substrate.

28. The method recited in claim 26 wherein etching the first portion comprises flowing the second precursor gas to provide a different distribution within the processing chamber than the first precursor gas, thereby effecting a nonuniform etching distribution over the substrate.

\* \* \* \* \*